(12) United States Patent
Otani et al.

(10) Patent No.: US 7,915,648 B2
(45) Date of Patent: Mar. 29, 2011

(54) LIGHT-RECEIVING ELEMENT AND DISPLAY DEVICE

(75) Inventors: Natsuki Otani, Kanagawa (JP);
Tsutomu Tanaka, Kanagawa (JP);
Masafumi Kunii, Kanagawa (JP);
Masanobu Ikeda, Kanagawa (JP);
Ryoichi Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/331,159

(22) Filed: Dec. 9, 2008

(65) Prior Publication Data
US 2009/0159893 A1 Jun. 25, 2009

(30) Foreign Application Priority Data

Dec. 25, 2007 (JP) .................................. 2007-332100
Sep. 5, 2008 (JP) .................................. 2008-228225

(51) Int. Cl.
*H01L 27/148* (2006.01)
(52) U.S. Cl. ........ 257/225; 257/219; 257/252; 257/290; 257/E31.063
(58) Field of Classification Search .................. 257/256, 257/458, 656, 219, 225, 252, 290
See application file for complete search history.

(56) References Cited

U.S. PATENT DOCUMENTS

| | | | | |
|---|---|---|---|---|
| 7,164,164 B2 * | 1/2007 | Nakamura et al. | ............ | 257/292 |
| 7,692,261 B2 * | 4/2010 | Hara et al. | ..................... | 257/458 |
| 2007/0228421 A1 * | 10/2007 | Shioya et al. | ................. | 257/213 |

FOREIGN PATENT DOCUMENTS

JP 2004-119719 4/2004

* cited by examiner

*Primary Examiner* — Wai-Sing Louie
(74) *Attorney, Agent, or Firm* — SNR Denton US LLP

(57) ABSTRACT

A light-receiving element includes: a first-conductivity-type semiconductor region configured to be formed over an element formation surface; a second-conductivity-type semiconductor region configured to be formed over the element formation surface; an intermediate semiconductor region configured to be formed over the element formation surface between the first-conductivity-type semiconductor region and the second-conductivity-type semiconductor region, and have an impurity concentration lower than impurity concentrations of the first-conductivity-type semiconductor region and the second-conductivity-type semiconductor region. The light-receiving element further includes: a first electrode configured to be electrically connected to the first-conductivity-type semiconductor region; a second electrode configured to be electrically connected to the second-conductivity-type semiconductor region; and a control electrode configured to be formed in an opposed area that exists on the element formation surface.

10 Claims, 19 Drawing Sheets

US 7,915,648 B2

LIGHT-RECEIVING ELEMENT AND DISPLAY DEVICE

CROSS REFERENCES TO RELATED APPLICATIONS

The present invention contains subject matter related to Japanese Patent Application JP 2008-228255, filed in the Japan Patent Office on Sep. 5, 2008, and Japanese Patent Application JP 2007-332100 filed in the Japan Patent Office on Dec. 25, 2007, the entire contents of which being incorporated herein by reference.

BACKGROUND OF THE INVENTION

1. Field of the Invention

The present invention relates to a light-receiving element having a control electrode and a display device including such a light-receiving element.

2. Description of Related Art

In recent years, for display devices such as a liquid crystal display device and an organic EL display device, a light-receiving element such as a photodiode is being widely used in order to detect and control the brightness and the contrast of a displayed image. The photodiode is incorporated in the display device together with a display element having a drive circuit composed of a thin film transistor (TFT) and so on.

As one kind of such a photodiode, a PIN photodiode having a planar shape is known. The PIN photodiode includes a p-type semiconductor region and an n-type semiconductor region that are formed over a transparent substrate surface and are composed of polycrystalline silicon, and an i-type semiconductor (intermediate semiconductor) region therebetween, formed over the transparent substrate surface and composed of polycrystalline silicon.

In Japanese Patent Laid-open No. 2004-119719, for example, a technique of controlling the threshold voltage by using a third electrode (gate electrode) for the PIN photodiode has been proposed.

SUMMARY OF THE INVENTION

For the photodiode formed together with a TFT over the same substrate in a display device as described above, the semiconductor thickness thereof needs to be small so that leakage current arising when the TFT is in the off-state may be suppressed. Therefore, the thickness (volume) of the intermediate semiconductor region as a light-receiving part is also small, which causes a problem that sufficient light-reception sensitivity cannot be ensured.

To address this problem, trial of increasing the W-length and the L-length of the gate electrode has been carried out as a method for increasing the volume of the intermediate semiconductor region as the light-receiving part to thereby enhance the light-reception sensitivity. However, when the W-length is increased, the parasitic capacitance also correspondingly increases in the overlap area between the gate electrode and the p-type semiconductor region or the n-type semiconductor region. Therefore, generated photocurrent is absorbed by this parasitic capacitance, and thus the effect of enhancing the photosensitivity effectively is limited. In addition, in the case of increasing the L-length, photocurrent is saturated when the L-length is increased to e.g. a value in the range of about 8 to 10 µm, and the photocurrent cannot be increased even if the L-length is further increased beyond this value.

As above, the related arts involve the limit to the increase in the photocurrent generated in the light-receiving element and hence involve difficulty in sufficient enhancement in the light-reception sensitivity.

There is a need for the present invention to provide a light-receiving element that is allowed to have sufficiently-enhanced light-reception sensitivity and a display device including such a light-receiving element.

According to an embodiment of the present invention, there is provided a first light-receiving element that includes a first-conductivity-type semiconductor region configured to be formed over an element formation surface, a second-conductivity-type semiconductor region configured to be formed over the element formation surface, and an intermediate semiconductor region configured to be formed over the element formation surface between the first-conductivity-type semiconductor region and the second-conductivity-type semiconductor region, and have an impurity concentration lower than the impurity concentrations of the first-conductivity-type semiconductor region and the second-conductivity-type semiconductor region. The first light-receiving element further includes a first electrode configured to be electrically connected to the first-conductivity-type semiconductor region, a second electrode configured to be electrically connected to the second-conductivity-type semiconductor region, and a control electrode configured to be formed in an opposed area that exists on the element formation surface and is opposed to the intermediate semiconductor region with the intermediary of an insulating film. In the first light-receiving element, the conductivity type of an impurity in the intermediate semiconductor region is the p-type, and voltage applied to the control electrode is positive potential.

According to another embodiment of the present invention, there is provided a first display device including a plurality of arranged display elements and the first light-receiving element.

In the first light-receiving element and the first display device, due to voltage application to the control electrode, photocurrent arising when the intermediate semiconductor region as a light-receiving part is irradiated with light can be controlled. Furthermore, due to the feature that the conductivity type of the impurity in the intermediate semiconductor region is the p-type and the voltage applied to the control electrode is positive potential, the intermediate semiconductor region has a structure of n-i-p along the thickness direction of the light-receiving element. Therefore, an electron-hole pair generated in a depletion layer is rapidly separated into an electron and a hole. Thus, the probability of trapping of electron-hole pairs by recombination centers is low, and increase in the L-length of the intermediate semiconductor region contributes to corresponding increase in the photocurrent.

According to another embodiment of the present invention, there is provided a second light-receiving element that includes a first-conductivity-type semiconductor region configured to be formed over an element formation surface, a second-conductivity-type semiconductor region configured to be formed over the element formation surface, and an intermediate semiconductor region configured to be formed over the element formation surface between the first-conductivity-type semiconductor region and the second-conductivity-type semiconductor region, and have an impurity concentration lower than the impurity concentrations of the first-conductivity-type semiconductor region and the second-conductivity-type semiconductor region. The second light-receiving element further includes a first electrode configured to be electrically connected to the first-conductivity-type semiconductor region, a second electrode configured to be electrically connected to the second-conductivity-type semiconductor region, and a control electrode configured to be formed in an opposed area that exists on the element formation surface and is opposed to the intermediate semiconductor region with the intermediary of an insulating film. In the second light-receiving element, the conductivity type of an impurity in the intermediate semiconductor region is the n-type, and voltage applied to the control electrode is negative potential.

According to another embodiment of the present invention, there is provided a second display device including a plurality of arranged display elements and the second light-receiving element.

In the second light-receiving element and the second display device, due to voltage application to the control electrode, photocurrent arising when the intermediate semiconductor region as a light-receiving part is irradiated with light can be controlled. Furthermore, due to the feature that the conductivity type of the impurity in the intermediate semiconductor region is the n-type and the voltage applied to the control electrode is negative potential, the intermediate semiconductor region has a structure of p-i-n along the thickness direction of the light-receiving element. Therefore, an electron-hole pair generated in a depletion layer is rapidly separated into an electron and a hole. Thus, the probability of trapping of electron-hole pairs by recombination centers is low, and increase in the L-length of the intermediate semiconductor region contributes to corresponding increase in the photocurrent.

In the first light-receiving element and the first display device, the conductivity type of the impurity in the intermediate semiconductor region is the p-type and the voltage applied to the control electrode is positive potential. Thus, an electron-hole pair generated in a depletion layer in the intermediate semiconductor region is rapidly separated, which can facilitate generation of photocurrent. Therefore, the photocurrent is not saturated even if the L-length of the intermediate semiconductor region is increased, and thus the light-reception sensitivity can be sufficiently enhanced.

Furthermore, in the second light-receiving element and the second display device, the conductivity type of the impurity in the intermediate semiconductor region is the n-type and the voltage applied to the control electrode is negative potential. Thus, an electron-hole pair generated in a depletion layer in the intermediate semiconductor region is rapidly separated, which can facilitate generation of photocurrent. Therefore, the photocurrent is not saturated even if the L-length of the intermediate semiconductor region is increased, and thus the light-reception sensitivity can be sufficiently enhanced.

DETAILED DESCRIPTION OF THE PREFERRED EMBODIMENTS

An embodiment of the present invention will be described in detail below with reference to the drawings.

(Configuration Example of Light-Receiving Element)

Figure 1:
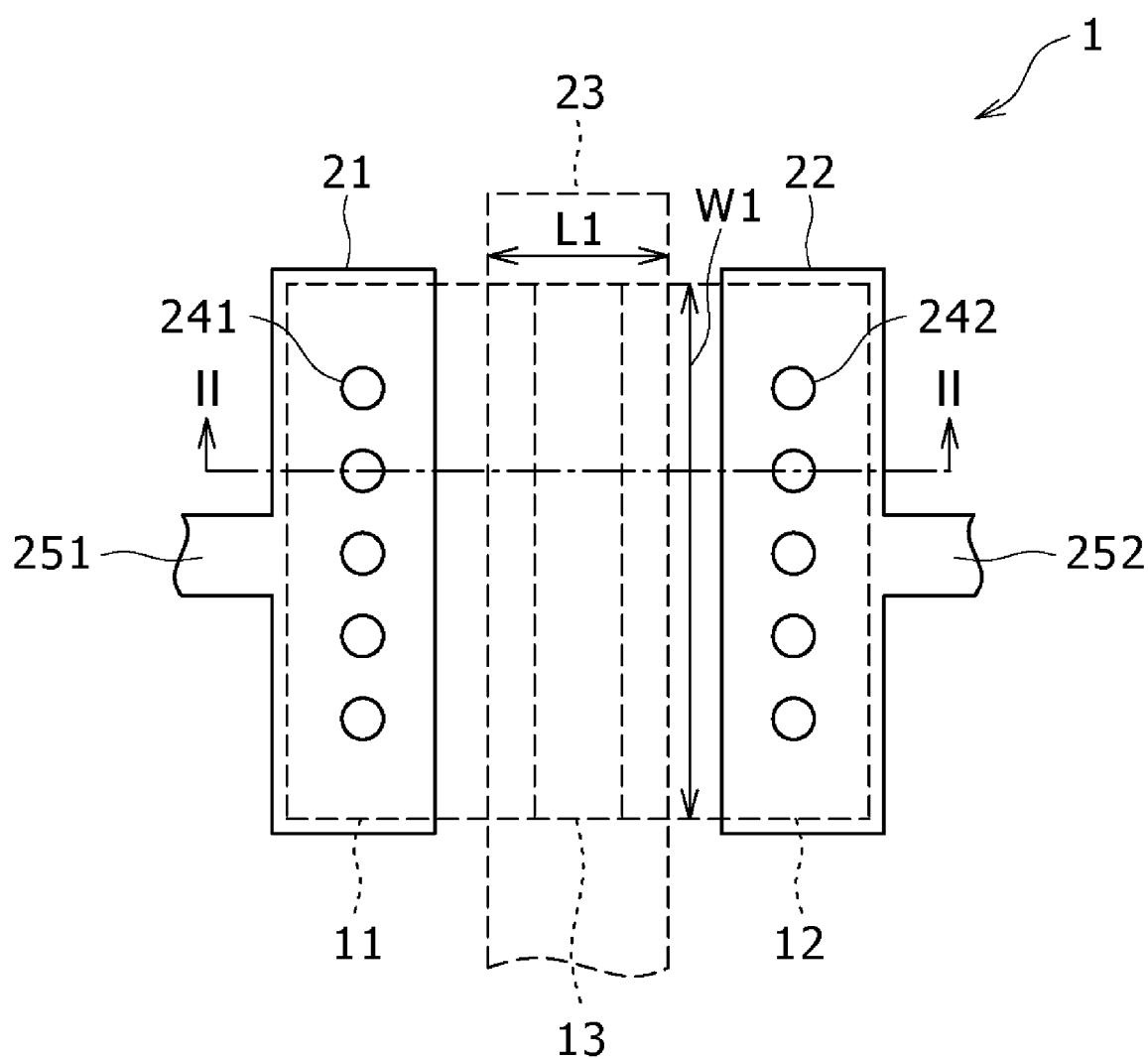
FIG. 1 is a plan view showing the configuration of a light-receiving element according to one embodiment of the present invention.
Figure 2:
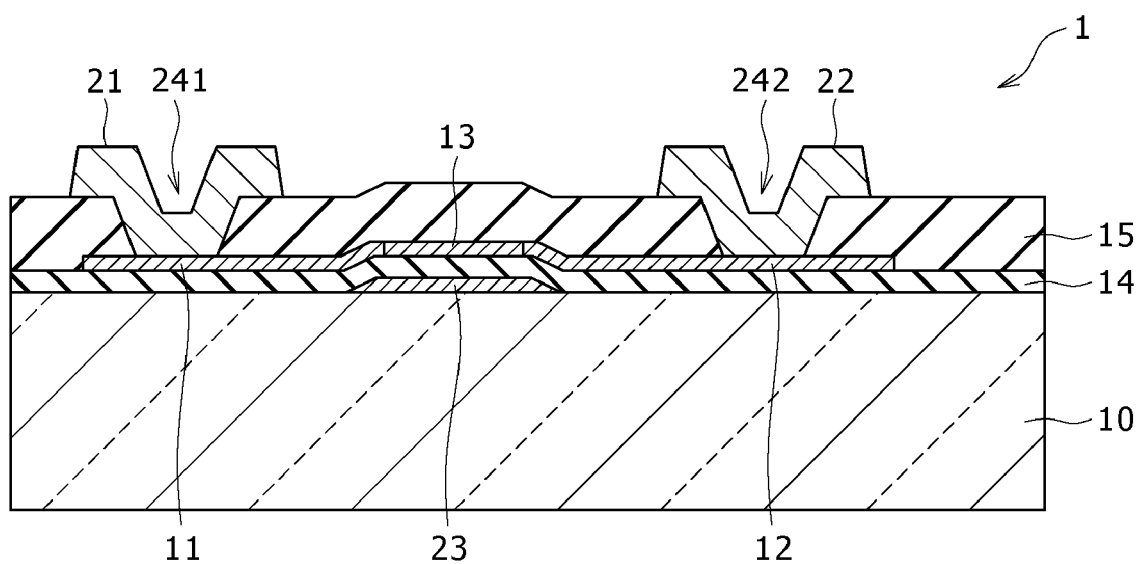
FIG. 2 is a sectional view showing the configuration of the light-receiving element shown in FIG. 1.

FIG. 1 shows the planar structure of a light-receiving element (light-receiving element 1) according to one embodiment of the present invention. FIG. 2 shows the sectional structure of the light-receiving element 1 along line II-II in FIG. 1.

The light-receiving element 1 is a photosensor having a so-called PIN photodiode. It has a glass substrate 10, a p+ layer 11 as a first-conductivity-type semiconductor region provided on one surface side of the glass substrate 10, an n+ layer 12 as a second-conductivity-type semiconductor region provided on the same surface side of the substrate 10 as that of the p+ layer 11, and a light-receiving part 13 as an intermediate semiconductor region provided between the p+ layer 11 and the n+ layer 12. The p+ layer 11 is electrically connected to an anode electrode 21 via a contact 241, and the n+ layer 12 is electrically connected to a cathode electrode 22 via a contact 242. On the same surface side of the glass substrate 10 as that of the p+ layer 11, the n+ layer 12, and the light-receiving part 13, a gate electrode 23 whose L-length and W-length are L1 and W1, respectively, is formed in an area opposed to the light-receiving part 13. A gate insulating film 14 is formed between the component group composed of the glass substrate 10 and the gate electrode 23 and the component group composed of the p+ layer 11, the n+ layer 12, and the light-receiving part 13. An interlayer insulating film 15 is formed between the component group composed of the p+ layer 11, the n+ layer 12, and the light-receiving part 13 and the component group composed of the anode electrode 21 and the cathode electrode 22. The anode electrode 21 is electrically connected to an interconnect layer 251, and the cathode electrode 22 is electrically connected to an interconnect layer 252.

The glass substrate 10 is a transparent substrate having optical transparency. Instead of using the glass substrate 10, a substrate may be formed by using a transparent (optically-transparent) material such as plastic, quartz, or aluminum oxide.

The gate insulating film 14 and the interlayer insulating film 15 are composed of an insulating material such as silicon nitride (SiN) or silicon oxide (SiO). These films may be formed by depositing a single layer, or alternatively may be formed as a mixture layer by using plural materials.

The p+ layer 11 is formed on the gate insulating film 14 in contact with the light-receiving part 13, and is composed of a p-type semiconductor doped with high concentration of a p-type impurity. The p-type impurity is, for example, boron. It is preferable that the p-type semiconductor be, for example, a crystalline semiconductor. This is because the crystalline semiconductor can provide higher carrier mobility. Examples of the crystalline semiconductor include polycrystalline silicon (polysilicon). The p+ layer 11 composed of polycrystalline silicon can be formed, for example, by depositing non-crystalline silicon (amorphous silicon) by chemical vapor deposition (CVD) and irradiating it with a laser beam such as an excimer laser beam to thereby melt and then solidify it. Therefore, it is preferable that a display device to be described later include the light-receiving element 1 because the light-receiving element 1 can be manufactured together with a drive circuit composed of a TFT and so on over the same substrate.

The n+ layer 12 is formed on the gate insulating film 14 in contact with the light-receiving part 13, and is composed of an n-type semiconductor doped with high concentration of an n-type impurity. The n-type impurity is, for example, phosphorus. It is preferable that the n-type semiconductor be, for example, a crystalline semiconductor. This is because higher carrier mobility can be obtained similarly to the p-type semiconductor. Examples of the crystalline semiconductor include polycrystalline silicon. The n+ layer 12 composed of polycrystalline silicon is preferable because it can be formed by a manufacturing method similar to that for the p+ layer 11, for example.

The light-receiving part 13 is a light-receiving region of the light-receiving element 1, and is formed on the gate insulating film 14 between the p+ layer 11 and the n+ layer 12 in contact with these layers. The light-receiving part 13 is an intermediate semiconductor region (n− layer) that is so formed as to have impurity (n-type impurity) concentration (in e.g. the range of about $1 \times 10^{17}$ to $5 \times 10^{18}$ (atm/cm$^3$)) lower than that of the n+ layer 12. The light-receiving part 13 may include a non-single-crystal semiconductor layer. Examples of the material of the non-single-crystal semiconductor layer include non-crystalline silicon, microcrystalline silicon, and polycrystalline silicon.

It is preferable that the thickness of the non-single-crystal semiconductor layer be as large as possible, and e.g. a thickness in the range of about 30 to 60 nm is desirable. This is because thickness smaller than this range leads to a decrease in photocurrent arising in the light-receiving part 13 whereas thickness larger than this range leads to increase in leakage current. It is desirable that the crystal grain size of polycrystalline silicon be in the range of about 50 nm to 1 μm. In the case of using microcrystalline silicon formed by CVD instead of using the above-described laser irradiation, it is desirable that the crystal grain size be in the range of about 10 to 100 nm.

The anode electrode 21 is electrically connected to the p+ layer 11 and is composed of an electrically-conductive material.

The cathode electrode 22 is electrically connected to the n+ layer 12 and is composed of an electrically-conductive material similarly to the anode electrode 21.

The gate electrode 23 is formed in an area opposed to the light-receiving part 13 with the intermediary of the gate insulating film 14. The gate electrode 23 functions as a control electrode that allows, through voltage application thereto, control of photocurrent arising when the light-receiving part 13 is irradiated with light. In the present embodiment, the conductivity type of the impurity (n-type impurity) in the light-receiving part 13 is the n-type, and the voltage applied to the gate electrode 23 is negative potential.

(Operation and Effect of Light-Receiving Element)

With reference to FIGS. 3 to 8 in addition to FIGS. 1 and 2, the operation and effect of the light-receiving element 1 of the present embodiment will be described in detail below, in comparison with a comparative example.

Initially, the basic operation of the light-receiving element 1 will be described below with reference to FIGS. 1 and 2. In the light-receiving element 1, upon irradiation of the light-receiving part 13 with light (upon the incidence of light on the light-receiving part 13), photocurrent is generated in the light-receiving part 13 depending on the amount of the incident light and flows between the p+ layer 11 and the n+ layer 12, which allows the element 1 to serve as a light-receiving element.

Figure 3:
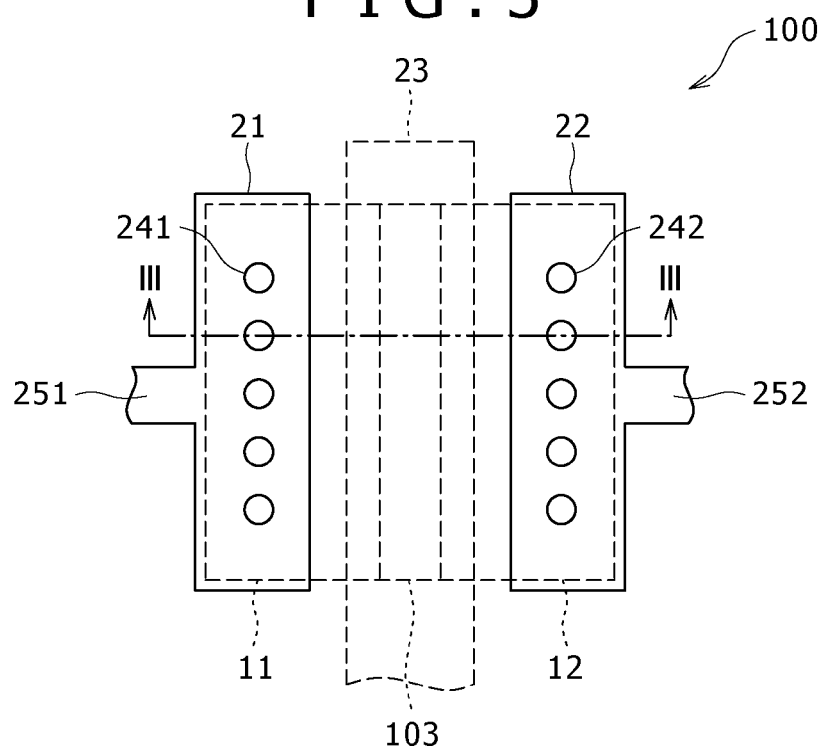
FIG. 3 is a plan view showing the configuration of a light-receiving element according to a comparative example.
Figure 4:
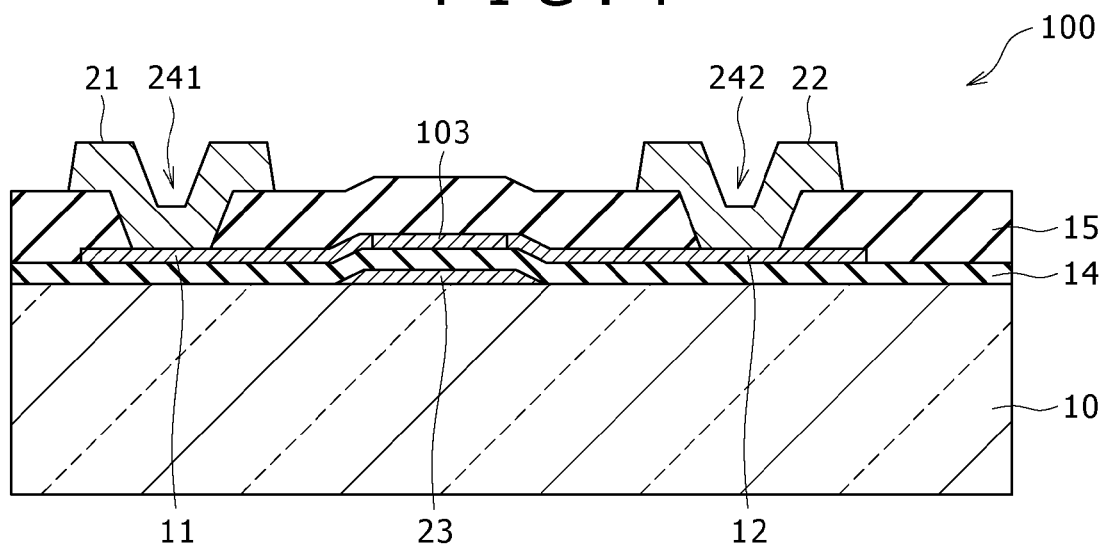
FIG. 4 is a sectional view showing the configuration of the light-receiving element according to the comparative example shown in FIG. 3.
Figure 5:
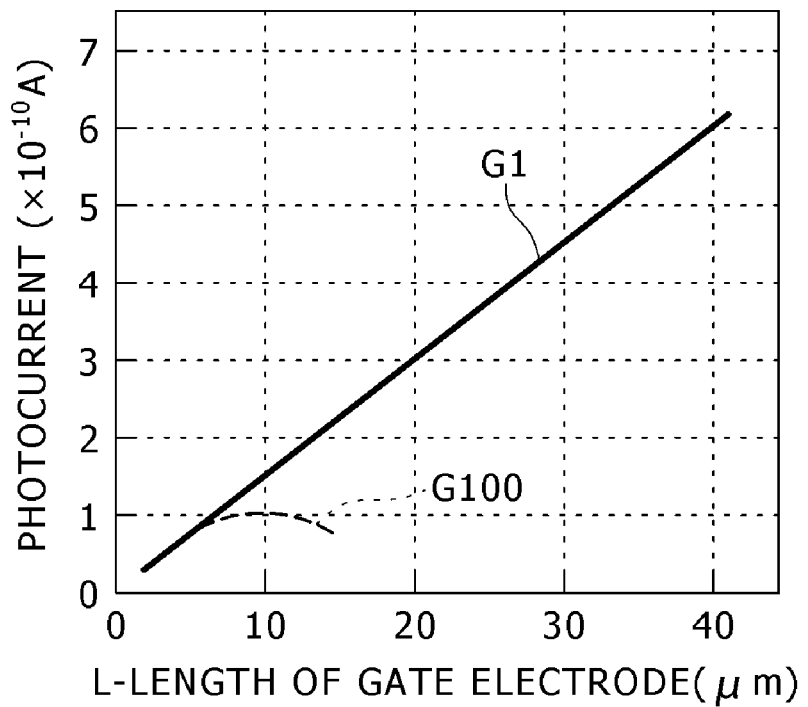
FIG. 5 is a characteristic diagram showing the relationship between the L-length of the gate electrode and photocurrent in the light-receiving elements shown in FIGS. 1 and 3.

Next, with reference to FIGS. 3 to 8, the characteristic operation and effect of the light-receiving element 1 will be described below, based on comparison with the comparative example. FIG. 3 shows the planar structure of a light-receiving element (light-receiving element 100) according to the comparative example. FIG. 4 shows the sectional structure of the light-receiving element 100 along line III-III in FIG. 3.

In the light-receiving element 100 of the comparative example, the voltage applied to the gate electrode 23 is negative potential, differently from the light-receiving element 1 of the present embodiment. Furthermore, the conductivity type of the impurity (p-type impurity) in a light-receiving part 103 is the p-type, or the light-receiving part 103 is an intrinsic layer (I layer).

Due to this configuration, if the conductivity type of the impurity (p-type impurity) in the light-receiving part 103 is the p-type, a depletion layer is not generated in the light-receiving part 103 as the intermediate semiconductor region in the light-receiving element 100 when the light-receiving part 103 is irradiated with light, and therefore photocurrent is also not generated. If the light-receiving part 103 is an intrinsic layer (I layer), the number of recombination centers in the light-receiving part 103 as the intermediate semiconductor region is large. Therefore, in the situation in which electron-hole pairs generated in the light-receiving part 103 travel across large L-length, these electron-hole pairs are easily trapped by the recombination centers and therefore do not contribute to generation of photocurrent. Thus, if the L-length of the light-receiving part is increased through increase in the L-length L1 of the gate electrode 23, photocurrent is saturated when the L-length is increased to some degree of length (L1=about 10 μm) as shown by the dashed-line curve given symbol G100 in FIG. 5, for example.

In contrast, in the light-receiving element 1 of the present embodiment, the conductivity type of the impurity (n-type impurity) in the light-receiving part 13 is the n-type, and the voltage applied to the gate electrode 23 is negative potential. Due to this configuration, when the light-receiving part 13 is irradiated with light, the light-receiving part 13 as the intermediate semiconductor region has a structure of p-i-n along the thickness direction of the light-receiving element 1. Therefore, an electron-hole pair generated in a depletion layer is rapidly separated into an electron and a hole. Thus, the probability of trapping of electron-hole pairs by recombination centers is low, and increase in the L-length of the light-receiving part 13 contributes to corresponding increase in photocurrent (facilitation of generation of photocurrent). Consequently, as shown by the line given symbol G1 in FIG. 5, for example, increasing the L-length can linearly increase photocurrent in a wide range (the range of 20 to about 40 μm as the range of L1), and thus can sufficiently enhance the light-reception sensitivity.

Figure 6:
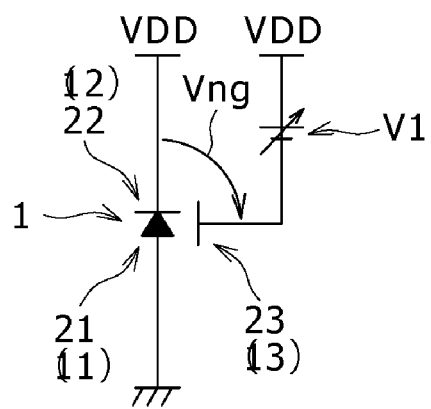
FIG. 6 is a circuit diagram for explaining a circuit used to measure the light-reception characteristic of the light-receiving element shown in FIG. 1.
Figure 7:
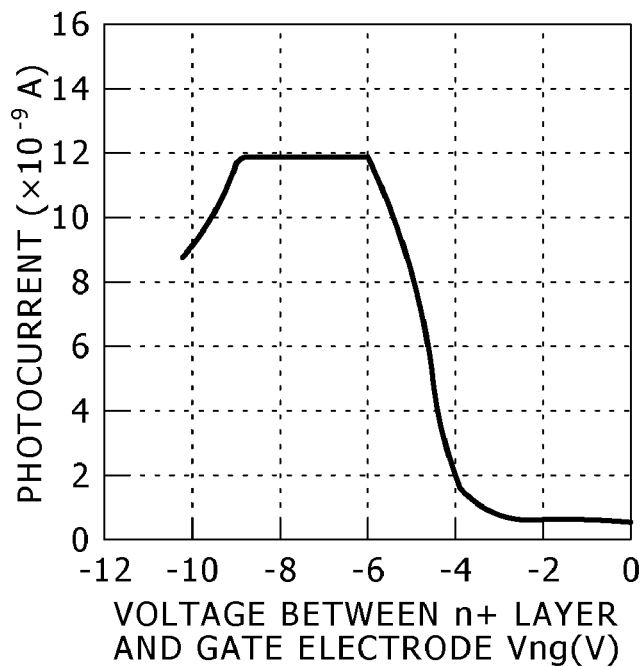
FIG. 7 is a characteristic diagram showing the relationship between the gate voltage and the photocurrent in the light-receiving element shown in FIG. 1.

Furthermore, the following feature can be found by, for example, as shown in FIG. 6, using a variable voltage supply V1 and applying reverse-bias voltage between the anode electrode 21 and the cathode electrode 22 of the light-receiving element 1. Specifically, it can be found that, as shown in FIG. 7, for example, the optimum range exists relating to voltage Vng between the n+ layer 12 and the gate electrode 23 (gate voltage Vg) in terms of the magnitude of generated photocurrent (light-reception sensitivity) (in FIG. 7, the optimum range is from about −6 to −9 V).

In addition, a parasitic capacitance generation area as the overlap area between the gate electrode 23 and the p+ layer 11 or the n+ layer 12 is not increased even when the L-length L1 is increased, which enhances the flexibility in the shape of the light-receiving element 1.

Figure 8:
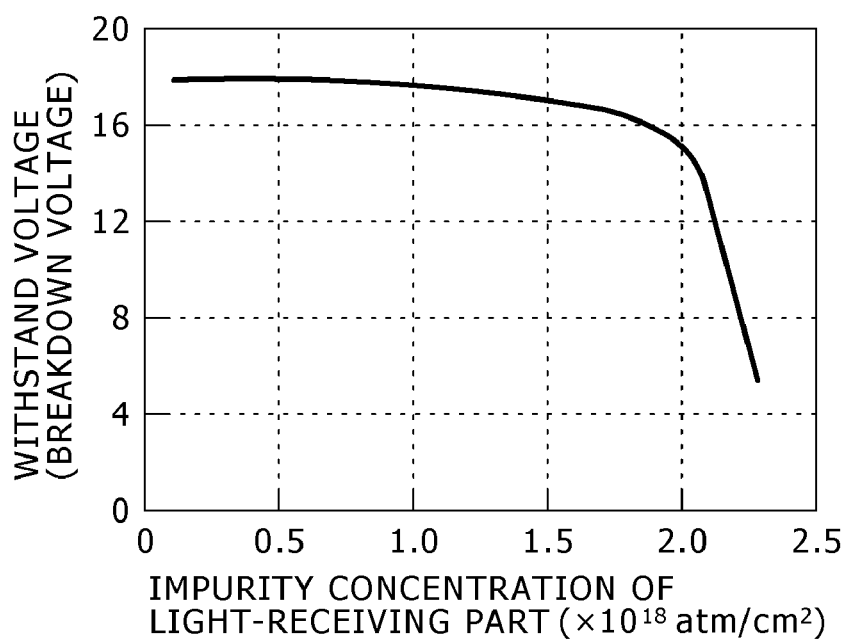
FIG. 8 is a characteristic diagram showing the relationship between the impurity concentration of the light-receiving part and the breakdown voltage in the light-receiving element shown in FIG. 1.

In this case, it is desirable that the impurity concentration of the light-receiving part 13 be lower than about $2 \times 10^{18}$ (atm/cm$^3$) as shown in FIG. 8, for example. This is because impurity concentration higher than this value leads to the drastic lowering of the withstand voltage (breakdown voltage) in the application of the gate voltage Vg.

As above, the present embodiment is so configured that the conductivity type of the impurity in the light-receiving part 13 is the n-type and the voltage applied to the gate electrode 23 is negative potential. Thus, an electron-hole pair generated in a depletion layer in the light-receiving part 13 is rapidly separated, which can facilitate generation of photocurrent. Therefore, the photocurrent is not saturated even when the L-length is increased (increasing the L-length can linearly increase the photocurrent in a wide range), which can sufficiently enhance the light-reception sensitivity.

MODIFICATION EXAMPLES

Modification examples of the embodiment of the present invention will be described below. The same component in the modification examples as that in the above-described embodiment is given the same numeral, and the description thereof is omitted.

First Modification Example

Figure 9:
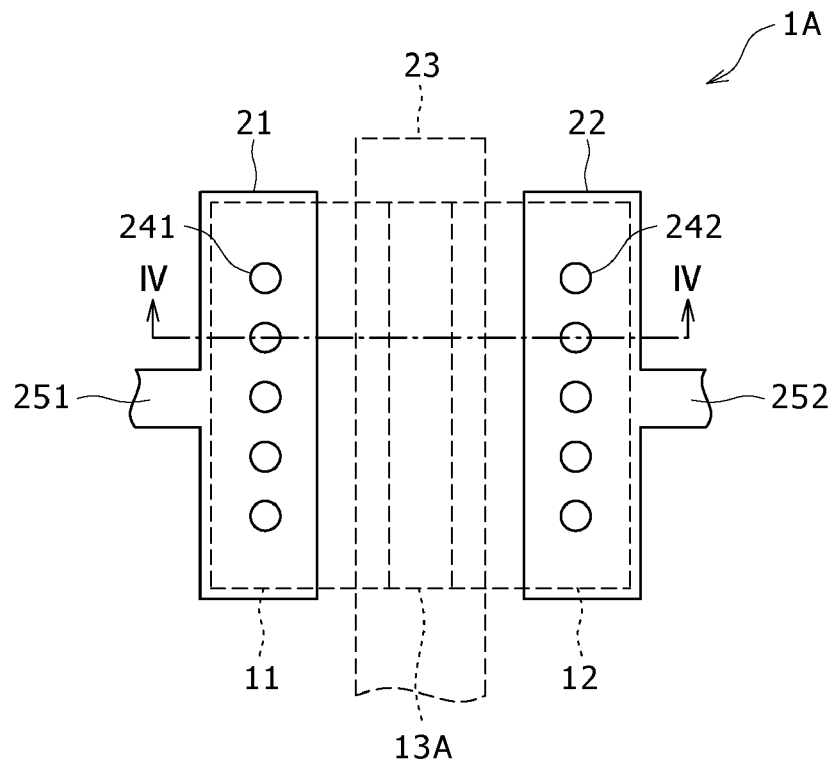
FIG. 9 is a plan view showing the configuration of a light-receiving element according to a first modification example of the embodiment of the present invention.
Figure 10:
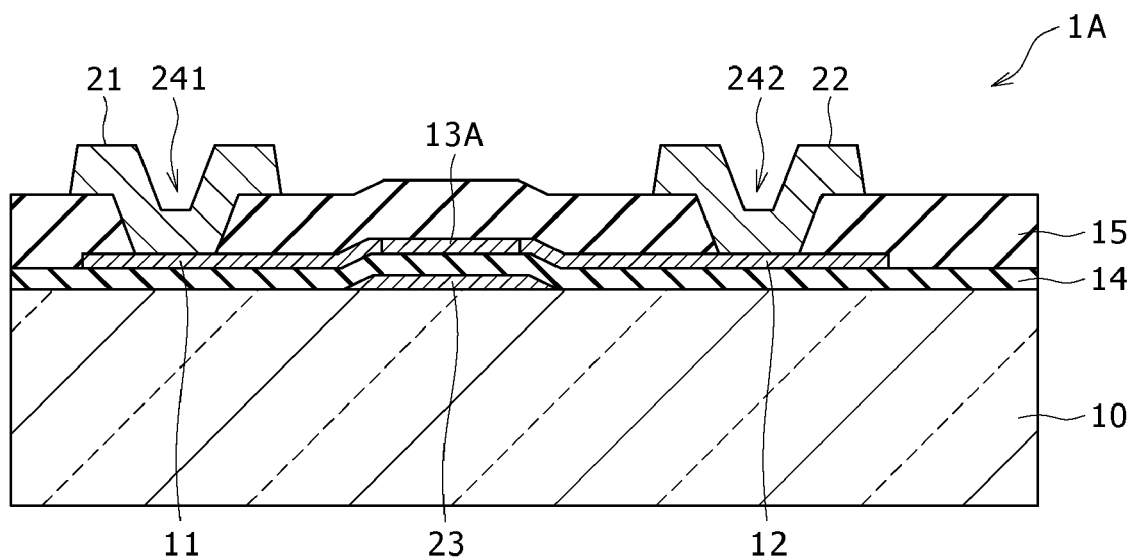
FIG. 10 is a sectional view showing the configuration of the light-receiving element according to the first modification example shown in FIG. 9.

FIG. 9 shows the planar structure of a light-receiving element (light-receiving element 1A) according to a first modification example. FIG. 10 shows the sectional structure of the light-receiving element 1A along line IV-IV in FIG. 9. In the light-receiving element 1A, the conductivity type of the impurity (p-type impurity) in a light-receiving part 13A is the p-type, and the voltage applied to the gate electrode 23 is positive potential. That is, the light-receiving part 13A is a p− layer.

Also in the light-receiving element 1A of the present modification example having such a configuration, generation of photocurrent can be facilitated and the light-reception sensitivity can be sufficiently enhanced due to the same operation as that of the above-described embodiment.

Second Modification Example

Figure 11:
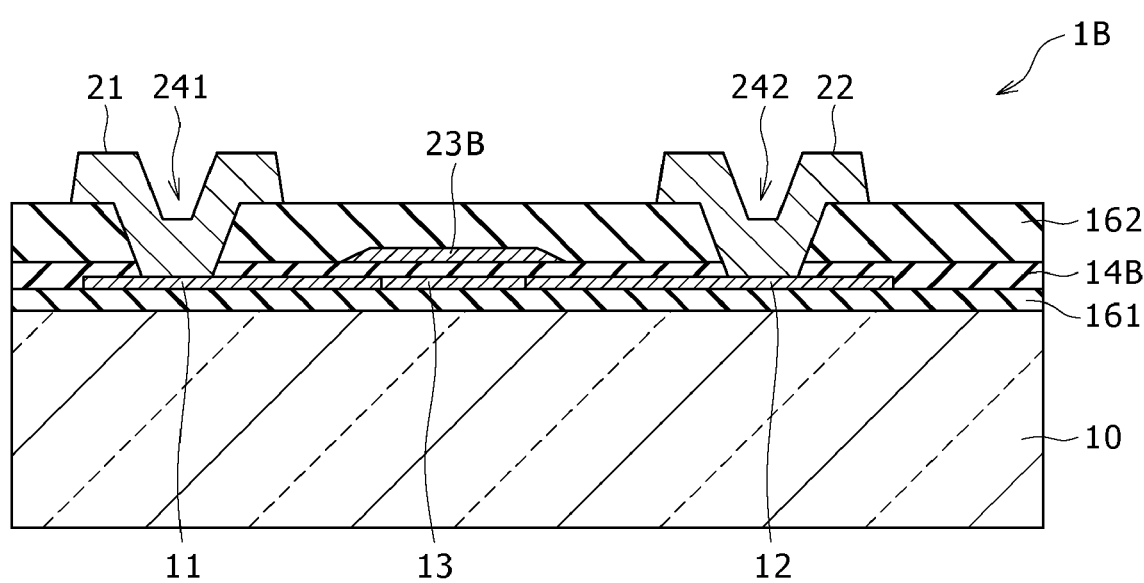
FIG. 11 is a sectional view showing the configuration of a light-receiving element according to a second modification example of the embodiment of the present invention.

FIG. 11 shows the sectional structure of a light-receiving element (light-receiving element 1B) according to a second modification example. The above-described embodiment and the first modification example relate to a bottom-gate light-receiving element in which the gate electrode 23 is formed under the p+ layer 11, the n+ layer 12, and the light-receiving part 13. In contrast, the light-receiving element 1B is a top-gate light-receiving element in which a gate electrode 23B is formed over the p+ layer 11, the n+ layer 12, and the light-receiving part 13. In the light-receiving element 1B, interlayer insulating films 161 and 162 and a gate insulating film 14B are formed.

Also in the light-receiving element 1B, the voltage applied to the gate electrode 23B is positive potential if the conductivity type of the impurity (p-type impurity) in the light-receiving part 13 is the p-type. On the other hand, the voltage applied to the gate electrode 23B is negative potential if the conductivity type of the impurity (n-type impurity) in the light-receiving part 13 is the n-type.

Also in the light-receiving element 1B of the present modification example having such a configuration, generation of photocurrent can be facilitated and the light-reception sensitivity can be sufficiently enhanced due to the same operation as that of the above-described embodiment and the first modification example.

Third and Fourth Modification Examples

Figure 12A:
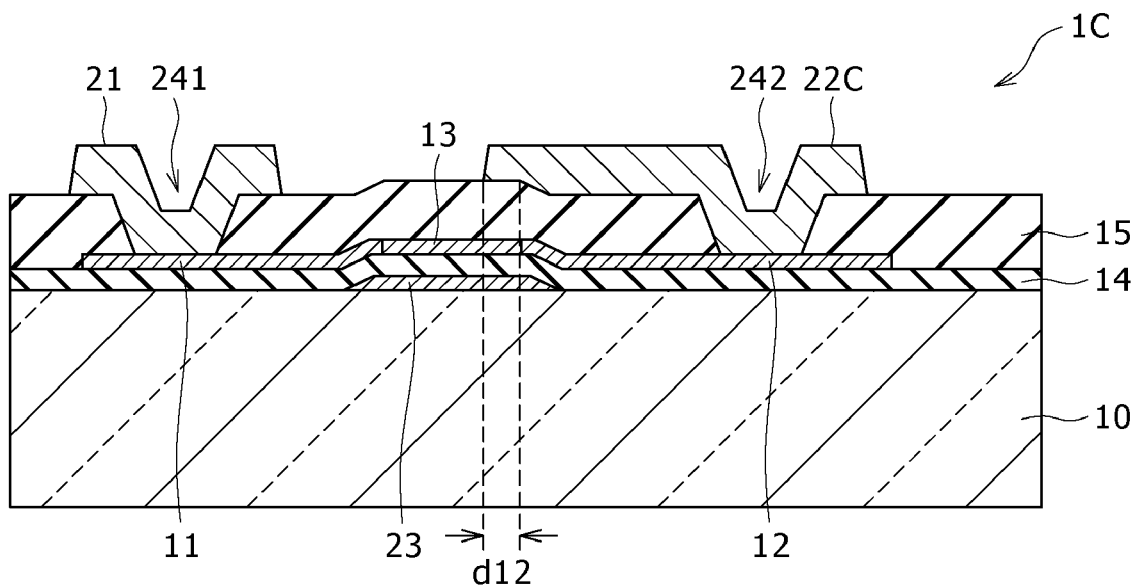
FIGS. 12A and 12B are sectional views showing the configurations of light-receiving elements according to third and fourth modification examples, respectively, of the embodiment of the present invention.
Figure 12B:
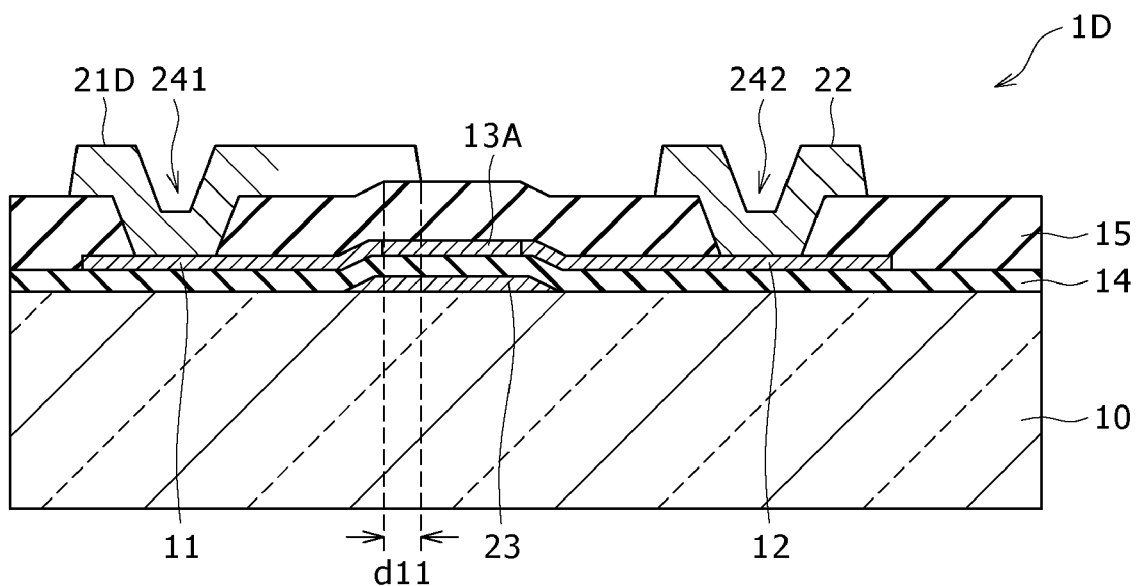

FIGS. 12A and 12B show the sectional structures of light-receiving elements (light-receiving elements 1C and 1D) according to third and fourth modification examples, respectively.

In the light-receiving element 1C, a cathode electrode 22C has an opposed region d12 that is opposed to the gate electrode 23 with the intermediary of at least a partial area of the light-receiving part 13. Furthermore, the light-receiving part 13 is so formed as to have impurity (n-type impurity) concentration lower than that of the n+ layer 12 (i.e. formed as an n− layer) In addition, the gate voltage Vg of negative potential is applied to the gate electrode 23 in light irradiation.

In the light-receiving element 1D, an anode electrode 21D has an opposed region d11 that is opposed to the gate electrode 23 with the intermediary of at least a partial area of the light-receiving part 13A. Furthermore, the light-receiving part 13A is so formed as to have impurity (p-type impurity) concentration lower than that of the p+ layer 11 (i.e. formed as a p− layer). In addition, the gate voltage Vg of positive potential is applied to the gate electrode 23 in light irradiation.

Figure 13:
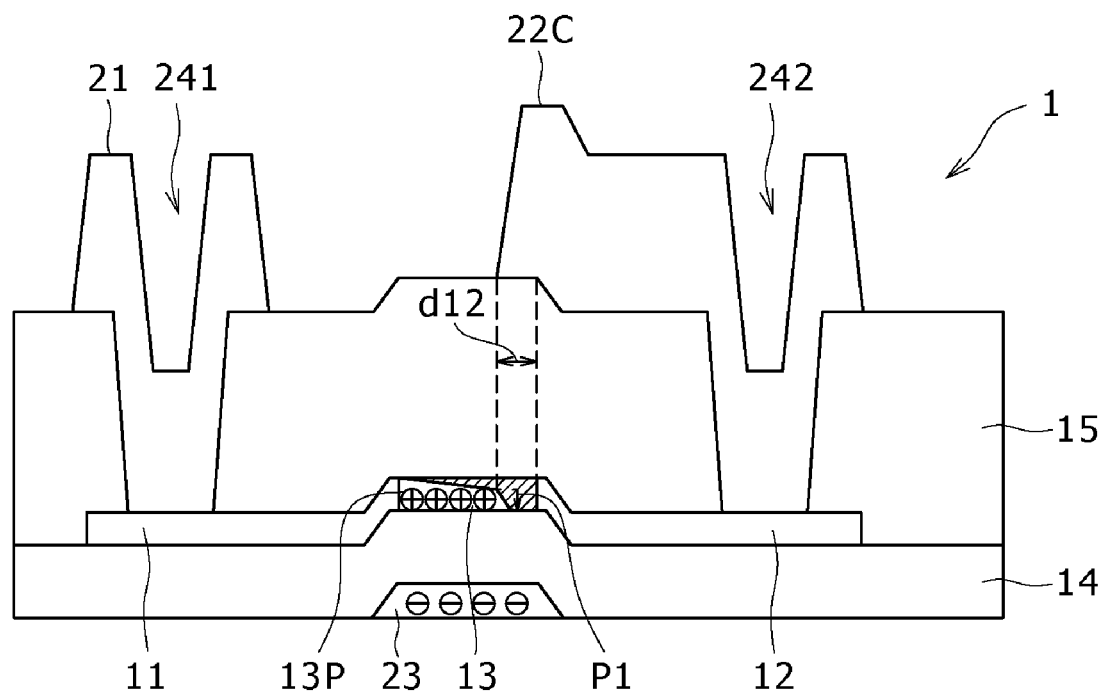
FIG. 13 is a sectional view for explaining the characteristic operation of the light-receiving element according to the third modification example shown in FIG. 12A.

Due to these configurations, the following advantage is achieved in the light-receiving elements 1C and 1D according to the third and fourth modification examples. Specifically, in the light-receiving element 1C shown in FIG. 13, for example, raising of the back-channel side toward the negative electrode side without limit when negative voltage is applied to the gate electrode 23 is prevented due to the applied voltage of the opposed region d12 of the cathode electrode 22C. Therefore, generation of a region 13P turned to a p-type region is suppressed in the light-receiving part 13 as the n− layer. This alleviates an electric field generated between the region 13P turned to a p-type region in the light-receiving part 13 and the n+ layer 12, and thus a breakdown phenomenon hardly occurs. Therefore, the manufacturing yield can also be enhanced. Also in the light-receiving element 1D, the same advantageous effect can be achieved due to the same operation.

Fifth and Sixth Modification Examples

Figure 14A:
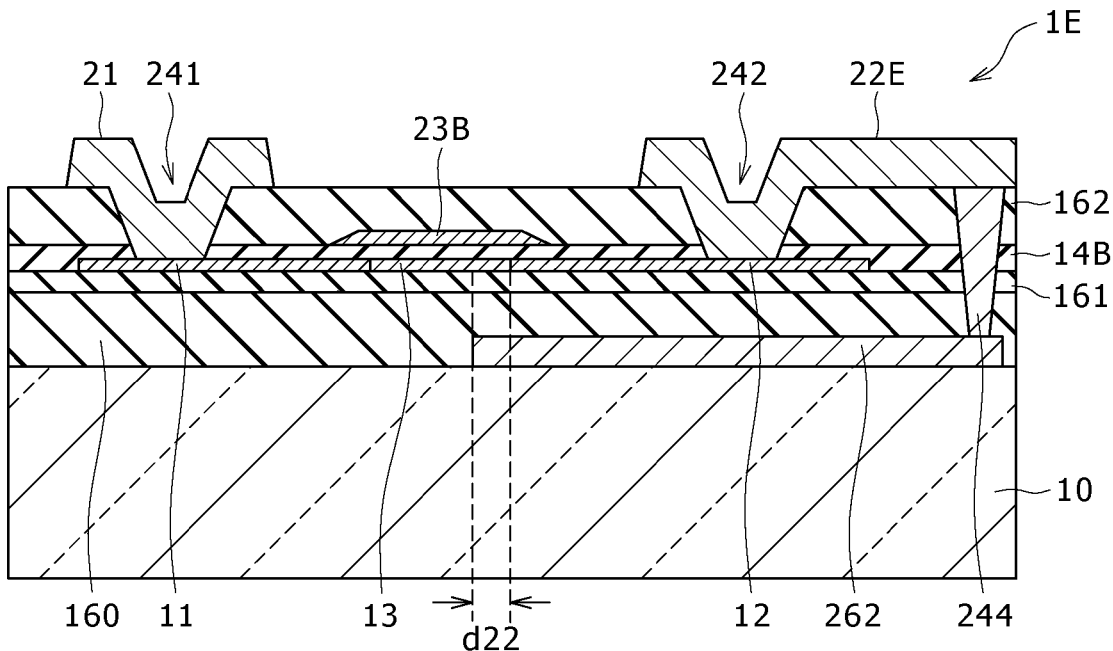
FIGS. 14A and 14B are sectional views showing the configurations of light-receiving elements according to fifth and sixth modification examples, respectively, of the embodiment of the present invention.
Figure 14B:
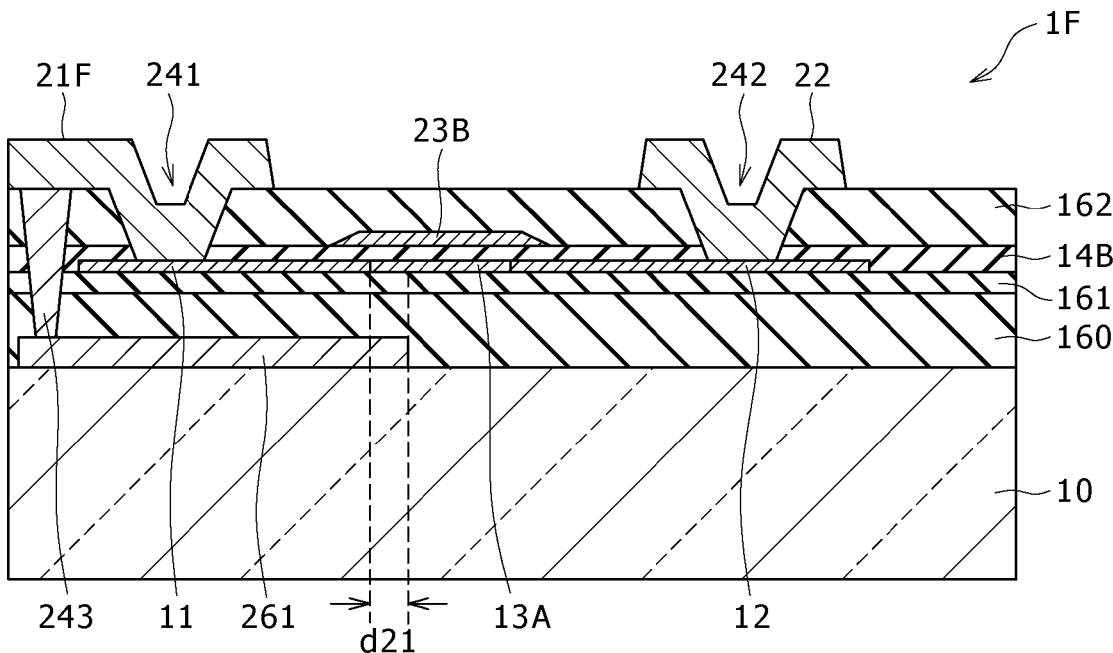

FIGS. 14A and 14B show the sectional structures of light-receiving elements (light-receiving elements 1E and 1F) according to fifth and sixth modification examples, respectively. These light-receiving elements 1E and 1F are top-gate light-receiving elements in which opposed regions similar to those described for the third and fourth modification examples are provided.

In the light-receiving element 1E, an electrode 262 electrically connected to a cathode electrode 22E via a contact 244 has an opposed region d22 that is opposed to the gate electrode 23B with the intermediary of at least a partial area of the light-receiving part 13. In the light-receiving element 1F, an electrode 261 electrically connected to an anode electrode 21F via a contact 243 has an opposed region d21 that is opposed to the gate electrode 23B with the intermediary of at least a partial area of the light-receiving part 13A.

Also in the light-receiving elements 1E and 1F according to the fifth and sixth modification examples having such a configuration, a breakdown phenomenon hardly occurs due to the same operation as that of the third and fourth modification examples, and thus the manufacturing yield can be enhanced.

Seventh Modification Example

Figure 15:
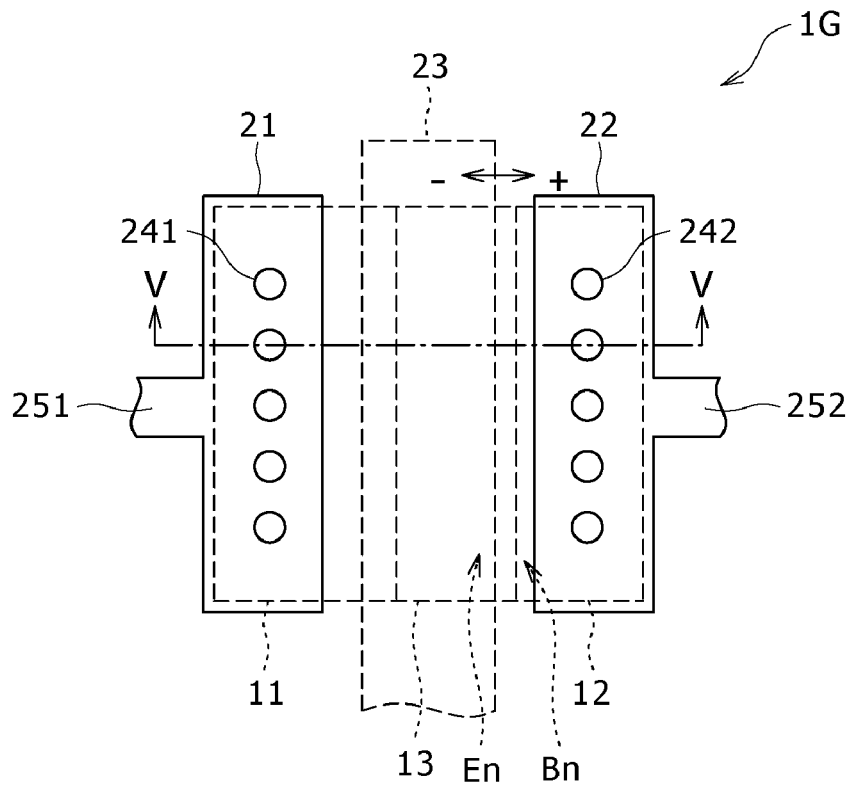
FIG. 15 is a plan view showing the configuration of a light-receiving element according to a seventh modification example of the embodiment of the present invention.
Figure 16:
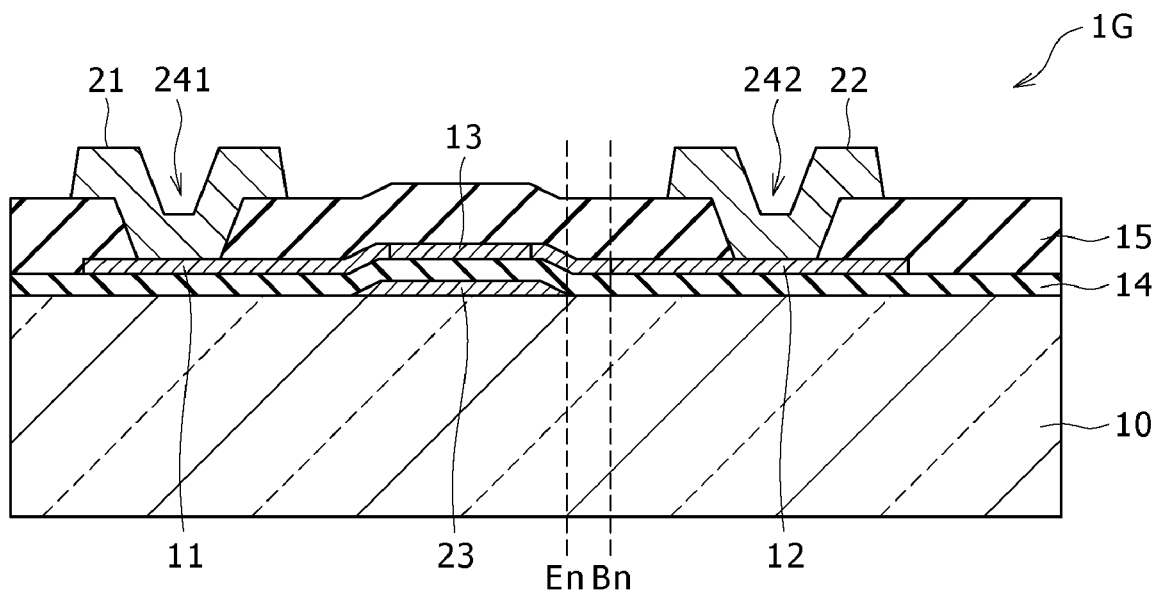
FIG. 16 is a sectional view showing the configuration of the light-receiving element according to the seventh modification example shown in FIG. 15.

FIG. 15 shows the planar structure of a light-receiving element (light-receiving element 1G) according to a seventh modification example. FIG. 16 shows the sectional structure of the light-receiving element 1G along line V-V in FIG. 15.

In the light-receiving element 1G of the present modification example, the light-receiving part 13 is so formed as to have impurity (n-type impurity) concentration lower than that of the n+ layer 12 (i.e. formed as an n− layer). In addition, the gate voltage Vg of negative potential is applied to the gate electrode 23 in light irradiation.

Moreover, in the light-receiving element 1G, a boundary Bn between the light-receiving part 13 (n− layer) and the n+ layer 12 is positioned closer to the opposite end of the n+ layer 12 (i.e. closer to the outside) than an end En of the gate electrode 23 closer to the n+ layer 12. This boundary Bn may be positioned above the end En.

This structure is to avoid a problem relating to the withstand voltage, to be described later. Specifically, if the conductivity type of the impurity in the light-receiving part 13 (n− layer) is the n-type and the voltage Vg applied to the gate electrode 23 is negative potential, a problem arises in the withstand voltage between the n+ layer 12 and the light-receiving part 13 (n− layer) when the gate voltage Vg surpasses certain voltage.

More specifically, in this case, holes are induced in the light-receiving part 13 (n− layer) above the gate electrode 23, and thus a p-n junction is formed in the vicinity of the interface (boundary Bn) between the n+ layer 12 and the light-receiving part 13 (n− layer). An internal electric field is strong between the p− region and the n+ region across the p-n junction formed due to the induced holes, which causes the problem relating to the withstand voltage.

However, if an n− layer unsusceptible to the influence of the electric field due to the gate electrode 23 can be provided between the p− region and the n+ region at the p-n junction part, the internal electric field between the p− region and the n+ region is alleviated, and thus the withstand voltage can be improved.

Therefore, in the light-receiving element 1G of the present modification example, the boundary Bn is positioned closer to the opposite end of the n+ layer 12 (i.e. closer to the outside) than the end En of the gate electrode 23 closer to the n+ layer 12. This structure reduces the influence of the electric field from the gate electrode 23. Thus, the problem relating to the withstand voltage can be avoided due to the alleviated electric field between the n+ region and the n− region, which enhances the sensitivity of the light-receiving element and allows the stable operation thereof.

Figure 17:
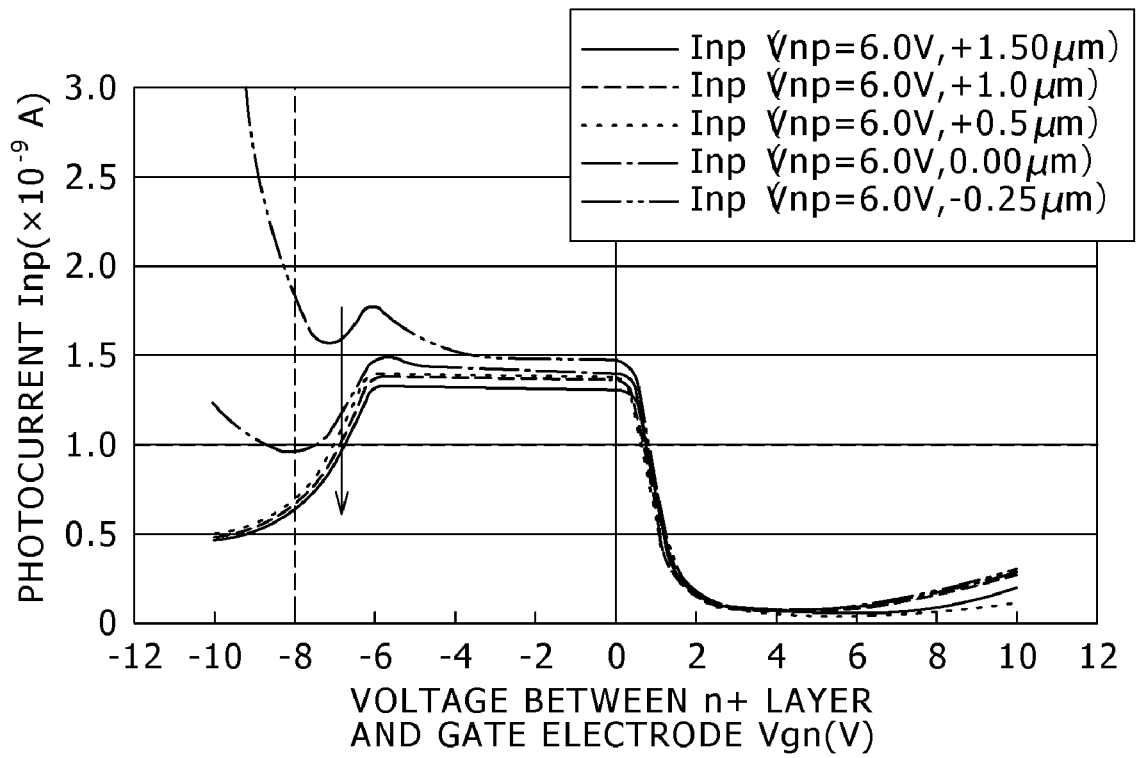
FIG. 17 is a characteristic diagram showing the relationship between the gate voltage and photocurrent in the light-receiving element according to the seventh modification example shown in FIG. 15.

FIG. 17 shows the relationship between the gate voltage Vgn and photocurrent Inp in the light-receiving element 1G. As the condition for the data of FIG. 17, Vnp is 6.0 V and the impurity concentration of the light-receiving part 13 is $1 \times 10^{18}$ (atm/cm$^3$). The data of FIG. 17 are based on changing of the position of the boundary Bn to the respective positions from +1.5 µm to −0.25 µm. As shown in FIG. 15, the sign "+" of the position of the boundary Bn means that the boundary Bn is positioned closer to the opposite end of the n+ layer 12

(i.e. closer to the outside) than the end En. On the other hand, the sign "−" means that the boundary Bn is positioned closer to the center of the light-receiving part 13 (n− layer) (i.e. closer to the inside) than the end En.

Referring to FIG. 17 with attention paid on the photocurrent Inp obtained when Vgn of −8 V is applied, if the boundary Bn is positioned closer to the center of the light-receiving part 13 (n− layer) (i.e. closer to the inside) than the end En, the photocurrent Inp larger than $1.0\times10^{-9}$ A flows, which proves that a problem exists in the withstand voltage. In contrast, if the boundary Bn is positioned closer to the opposite end of the n+ layer 12 (i.e. closer to the outside) than the end En, the problem of the withstand voltage does not occur.

Figure 18:
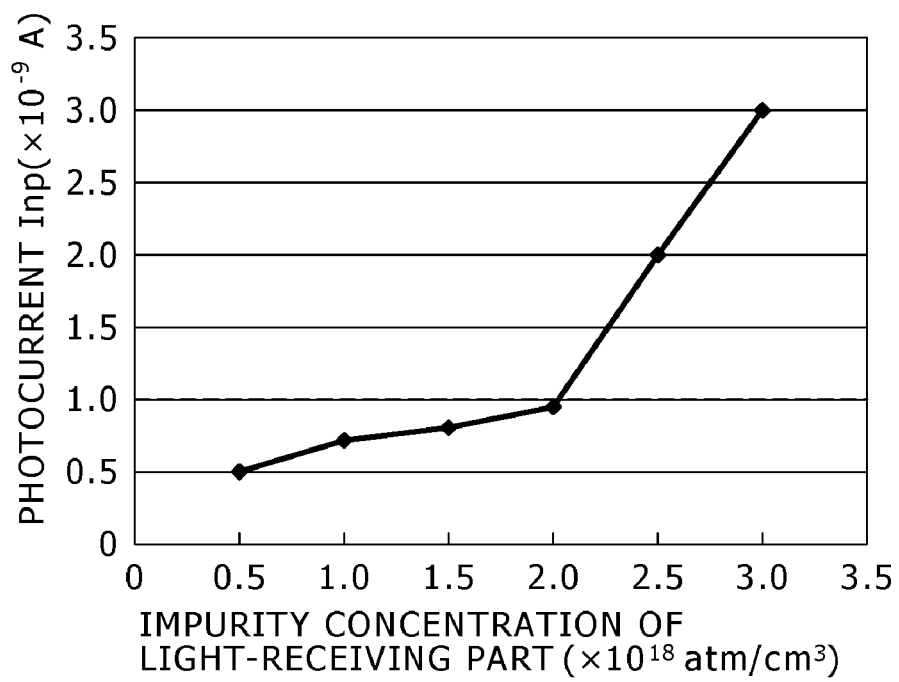
FIG. 18 is a characteristic diagram showing the relationship between the impurity concentration of the light-receiving part and the photocurrent in the light-receiving element according to the seventh modification example shown in FIG. 15.

FIG. 18 shows the relationship between the impurity concentration of the light-receiving part 13 and the photocurrent Inp in the light-receiving element 1G. As the condition for the data of FIG. 18, the gate voltage Vgn is −8 V, and the position of the boundary Bn is 0.0 μm (i.e. the boundary Bn is positioned above the end En).

FIG. 18 proves that the impurity concentration should be equal to or lower than $2\times10^{18}$ (atm/cm$^3$) if the conductivity type of the impurity is the n-type.

Eighth Modification Example

Figure 19:
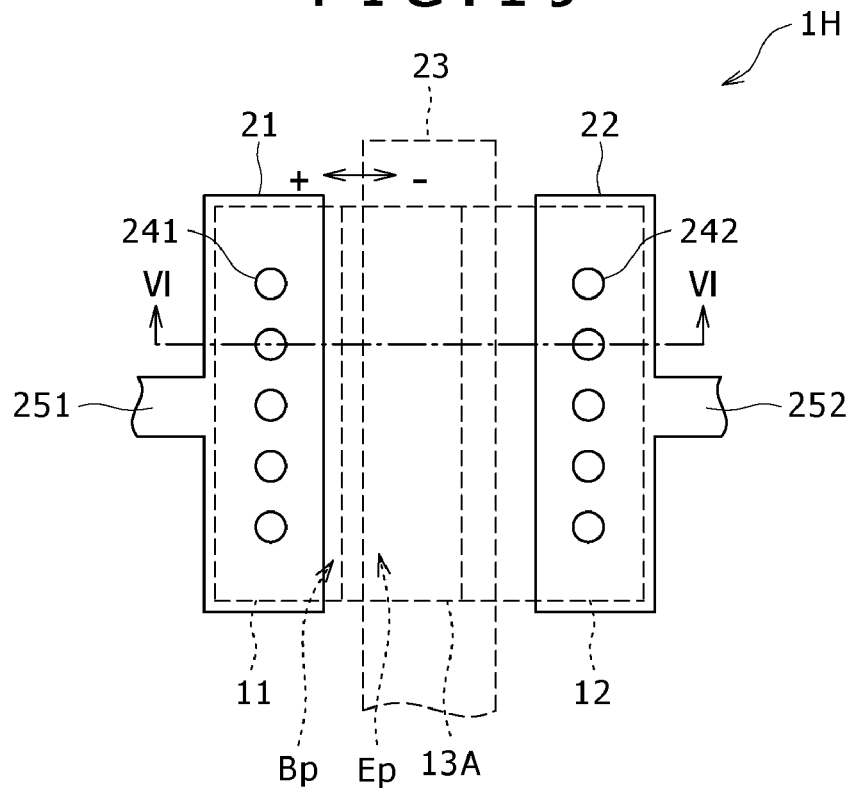
FIG. 19 is a plan view showing the configuration of a light-receiving element according to an eighth modification example of the embodiment of the present invention.
Figure 20:
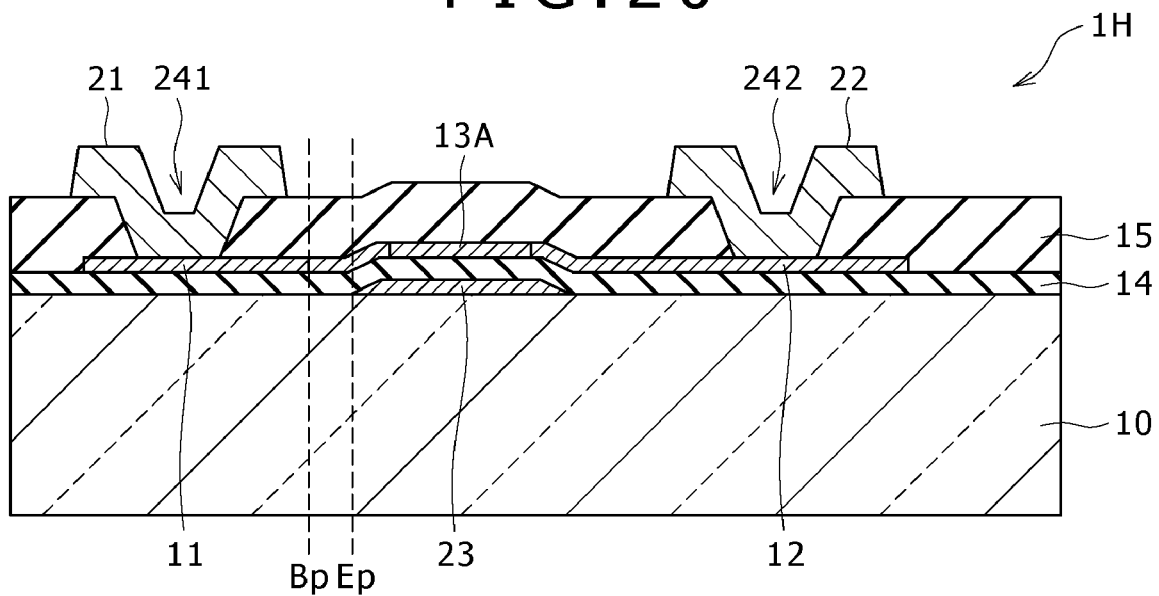
FIG. 20 is a sectional view showing the configuration of the light-receiving element according to the eighth modification example shown in FIG. 19.

FIG. 19 shows the planar structure of a light-receiving element (light-receiving element 1H) according to an eighth modification example. FIG. 20 shows the sectional structure of the light-receiving element 1H along line VI-VI in FIG. 19.

In the light-receiving element 1H of the present modification example, the light-receiving part 13A is so formed as to have impurity (p-type impurity) concentration lower than that of the p+ layer 11 (i.e. formed as a p− layer). In addition, the gate voltage Vg of positive potential is applied to the gate electrode 23 in light irradiation.

Moreover, in this light-receiving element 1H, a boundary Bp between the light-receiving part 13A (p− layer) and the p+ layer 11 is positioned closer to the end of the p+ layer 11 on the opposite side to the boundary Bp (i.e. closer to the outside) than an end Ep of the gate electrode 23 closer to the p+ layer 11. This boundary Bp may be positioned above the end Ep.

This structure is to avoid the problem of the withstand voltage, described for the seventh modification example, similarly to the light-receiving element 1G of the seventh modification example.

Therefore, in the light-receiving element 1H of the present modification example, the boundary Bp is positioned closer to the opposite end of the p+ layer 11 (i.e. closer to the outside) than the end Ep of the gate electrode 23 closer to the p+ layer 11. This structure reduces the influence of the electric field from the gate electrode 23. Thus, the problem relating to the withstand voltage can be avoided due to the alleviated electric field between the p+ region and the p− region, which enhances the sensitivity of the light-receiving element and allows the stable operation thereof.

Figure 21:
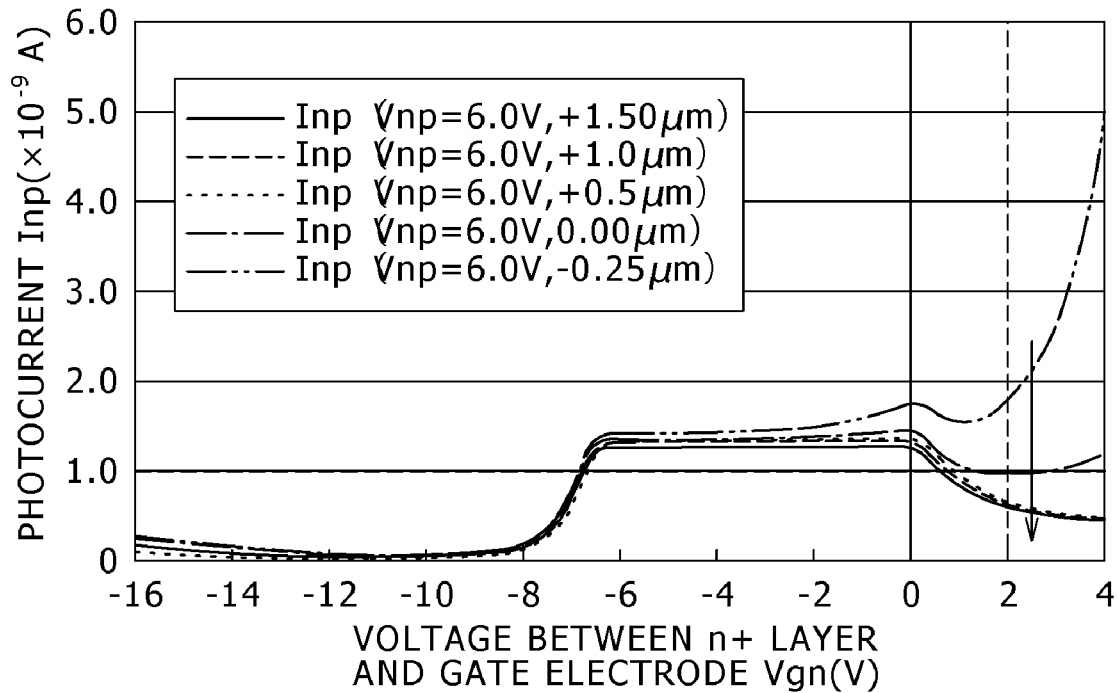
FIG. 21 is a characteristic diagram showing the relationship between the gate voltage and photocurrent in the light-receiving element according to the eighth modification example shown in FIG. 19.

FIG. 21 shows the relationship between the gate voltage Vgn and the photocurrent Inp in the light-receiving element 1H. As the condition for the data of FIG. 21, Vnp is 6.0 V and the impurity concentration of the light-receiving part 13A is $1\times10^{18}$ (atm/cm$^3$). The data of FIG. 21 are based on changing of the position of the boundary Bp to the respective positions from +1.5 μm to −0.25 μm. As shown in FIG. 19, the sign "+" of the position of the boundary Bp means that the boundary Bp is positioned closer to the opposite end of the n+ layer 11 (i.e. closer to the outside) than the end Ep. On the other hand, the sign "−" means that the boundary Bp is positioned closer to the center of the light-receiving part 13A (p− layer) (i.e. closer to the inside) than the end Ep.

Referring to FIG. 21 with attention paid on the photocurrent Inp obtained when Vgn of 2 V is applied, if the boundary Bp is positioned closer to the center of the light-receiving part 13A (p− layer) (i.e. closer to the inside) than the end Ep, the photocurrent Inp larger than $1.0\times10^{-9}$ A flows, which proves that a problem exists in the withstand voltage. In contrast, if the boundary Bp is positioned closer to the opposite end of the p+ layer 11 (i.e. closer to the outside) than the end Ep, the problem of the withstand voltage does not occur.

Figure 22:
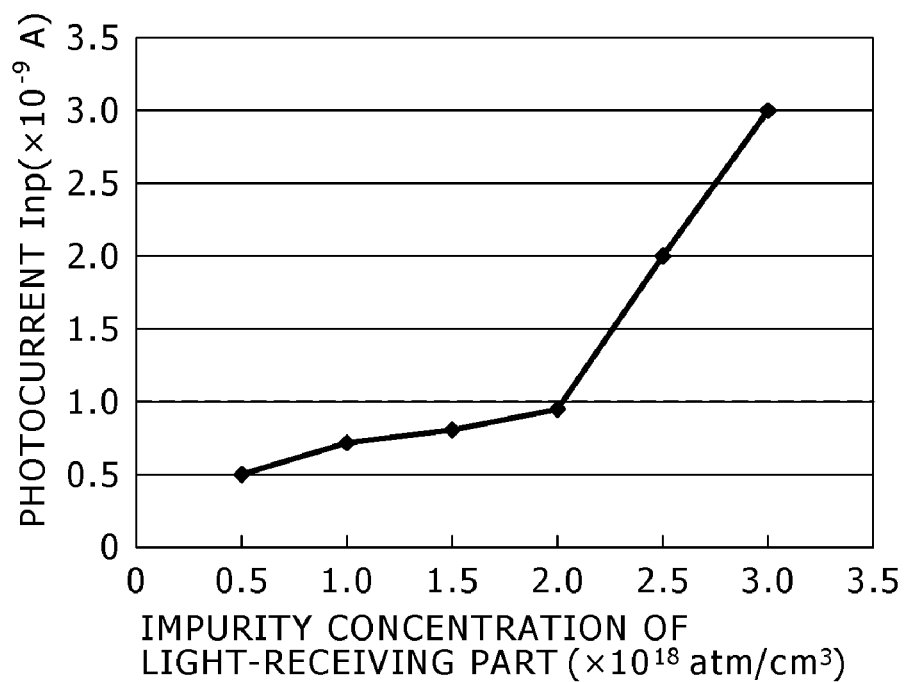
FIG. 22 is a characteristic diagram showing the relationship between the impurity concentration of the light-receiving part and the photocurrent in the light-receiving element according to the eighth modification example shown in FIG. 19.

FIG. 22 shows the relationship between the impurity concentration of the light-receiving part 13A and the photocurrent Inp in the light-receiving element 1H. As the condition for the data of FIG. 22, the gate voltage Vgn is 8 V, and the position of the boundary Bp is 0.0 μm (i.e. the boundary Bp is positioned above the end Ep).

FIG. 22 proves that the impurity concentration should be equal to or lower than $2\times10^{18}$ (atm/cm$^3$) if the conductivity type of the impurity is the p-type.

Ninth Modification Example

Figure 23:
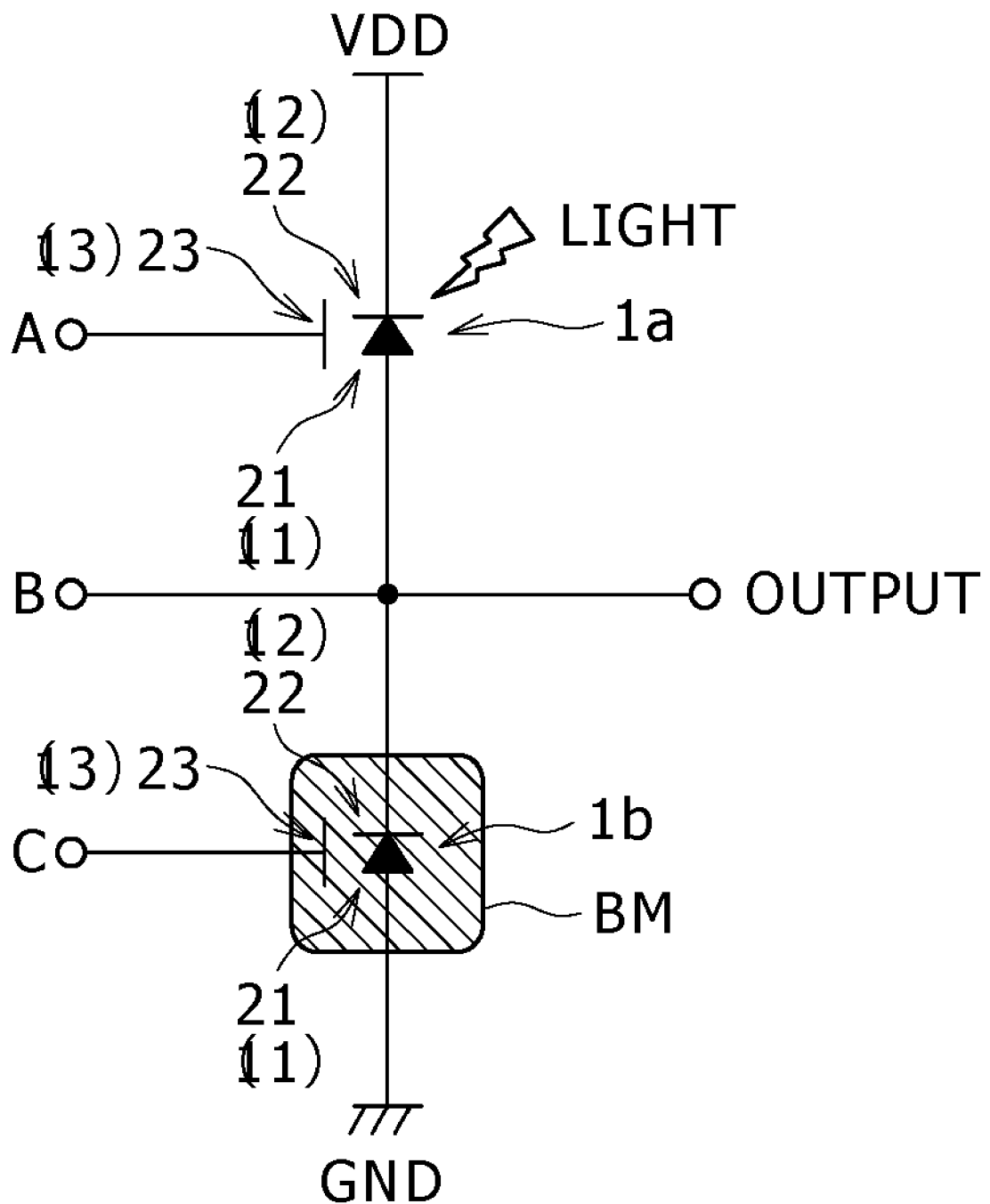
FIG. 23 is a circuit diagram showing the configuration of a light-receiving element according to a ninth modification example of the embodiment of the present invention.
Figure 24:
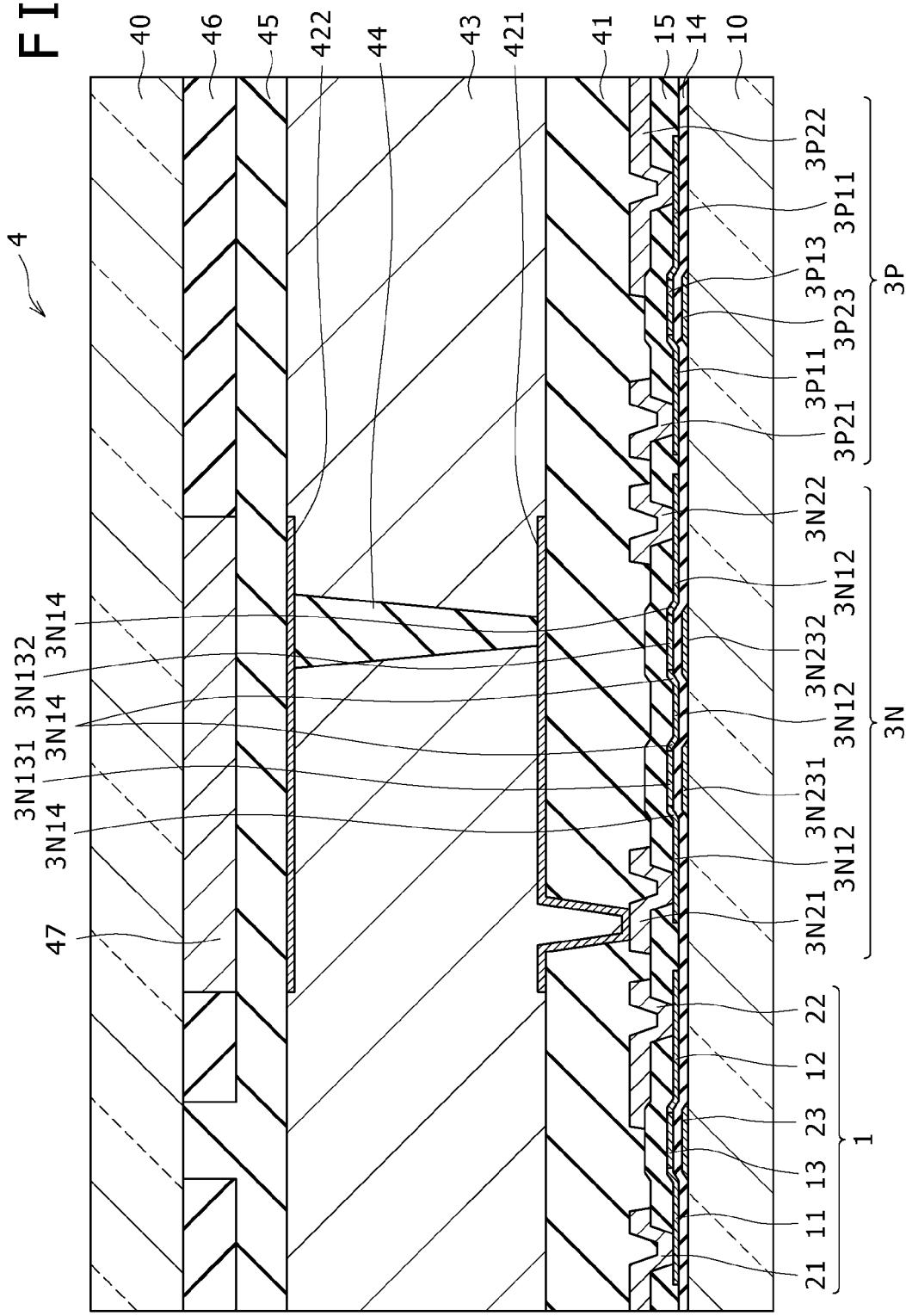
FIG. 24 is a sectional view showing one example of a liquid crystal display device including the light-receiving element shown in FIG. 1.

FIG. 23 shows the circuit configuration of a light-receiving element according to a ninth modification example. The light-receiving element circuit of the present modification example is composed of two light-receiving elements 1a and 1b (each of which is formed of the light-receiving element 1 or another light-receiving element described above). Specifically, two light-receiving elements 1a and 1b connected in series to each other are disposed between a power supply VDD and a ground GND.

For the light-receiving element 1a, a cathode electrode 22 thereof is connected to the power supply VDD, an anode electrode 21 thereof is connected to a terminal B and an output terminal, and a gate electrode 23 thereof is connected to a terminal A. For the light-receiving element 1b, a cathode electrode 22 thereof is connected to the terminal B and the output terminal, an anode electrode 21 thereof is connected to the ground GND, and a gate electrode 23 thereof is connected to a terminal C.

The light-receiving element 1b is disposed under a black matrix BM (in the formation area of the black matrix BM) in order to compensate environmental disturbance. On the other hand, the light-receiving element 1a is disposed in an area other than the formation area of the black matrix BM so that the illuminance can be measured.

Boron is ion-implanted into the light-receiving part 13 of the light-receiving elements 1a and 1b so that the light-receiving part 13 may be a p-type region. The concentration of the boron should be equal to or lower than $2\times10^{18}$ (atm/cm$^3$) in terms of the limit to the withstand voltage, and it is preferable that the concentration be in the range of $1.5\times10^{16}$ to $3.5\times10^{17}$ (atm/cm$^3$).

It is preferable that the potentials VA, VB, and VC of the terminals A, B, and C, the supply potential VDD, and the ground potential GND shown in FIG. 23 be so designed as to satisfy the following Equation (1). This is because satisfying Equation (1) allows stable photocurrent output.

$$GND<VC<VB<VA<VDD \qquad (1)$$

This is the end of the description of the embodiment of the present invention and the modification examples thereof. However, the present invention is not limited to the embodiment and so on, but various modifications are possible.

For example, it is preferable that at least the opposed region (opposed region d11, d12, d21, d22) of the cathode electrode or the electrode electrically connected to the cathode electrode and the anode electrode or the electrode electrically connected to the anode electrode, described for the embodiment, be a transparent electrode composed of a transparent material such as indium tin oxide (ITO). This configuration enhances the efficiency of light incidence on the light-receiving part, and thus allows further enhancement in the light-reception sensitivity.

The effect by the embodiment of the present invention is not limited to one with respect to visible light, but can be achieved also with respect to invisible light (e.g. X-ray, electron beam, UV light, infrared light). In particular, an effective light-receiving element can be achieved if the embodiment of the present invention is used for light having energy near the band gap of the semiconductor layer.

Furthermore, although mainly a silicon thin film is used as the semiconductor layer in the embodiment of the present invention, any material may be used for the semiconductor layer as long as it is a semiconductor material that can be controlled by an electric field. Examples of other materials include SiGe, Ge, Se, an organic semiconductor film, and an oxide semiconductor film.

Figure 25:
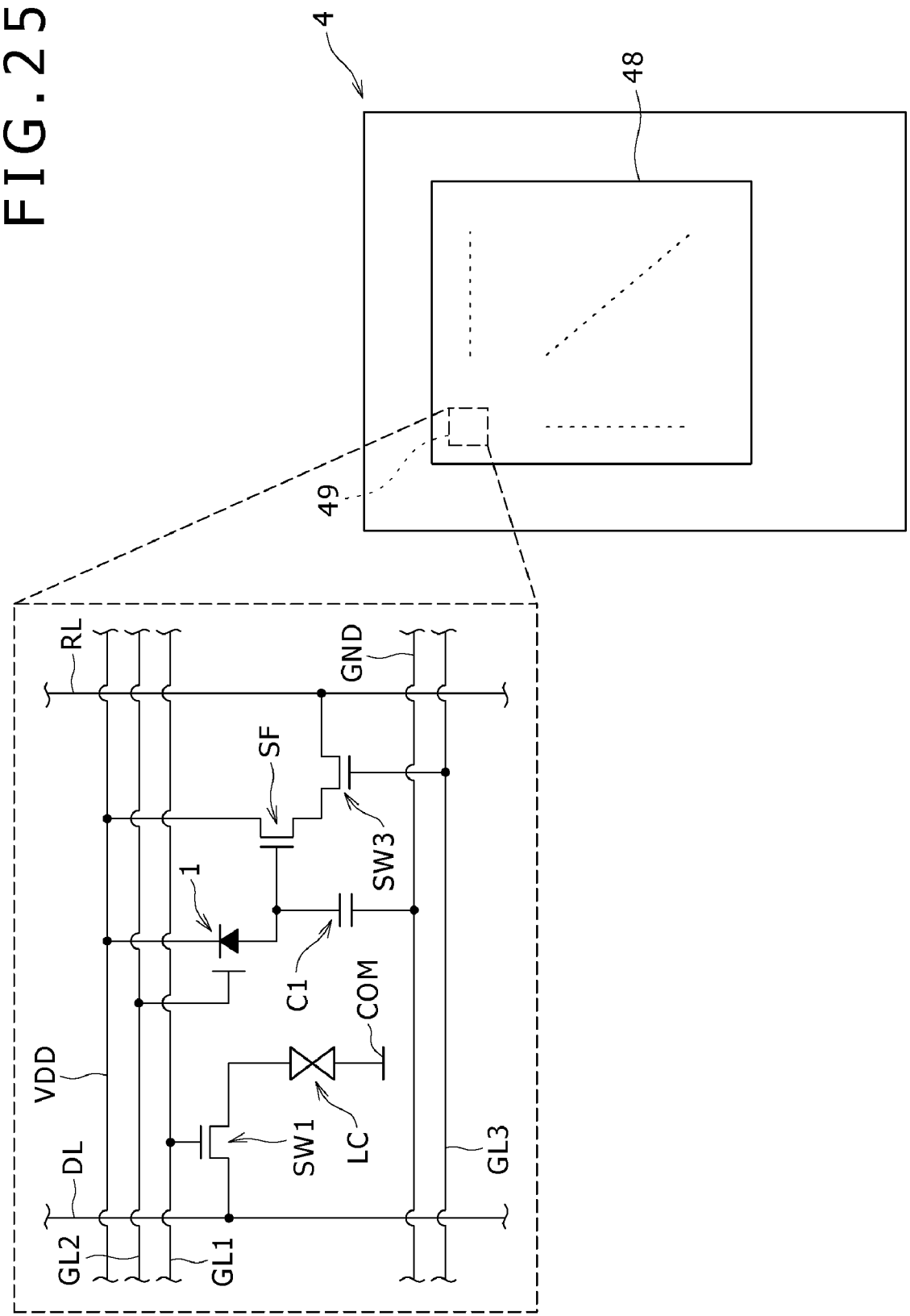
FIG. 25 is a plan view and a circuit diagram showing one example of a pixel circuit in the liquid crystal display device shown in FIG. 24.
Figure 26:
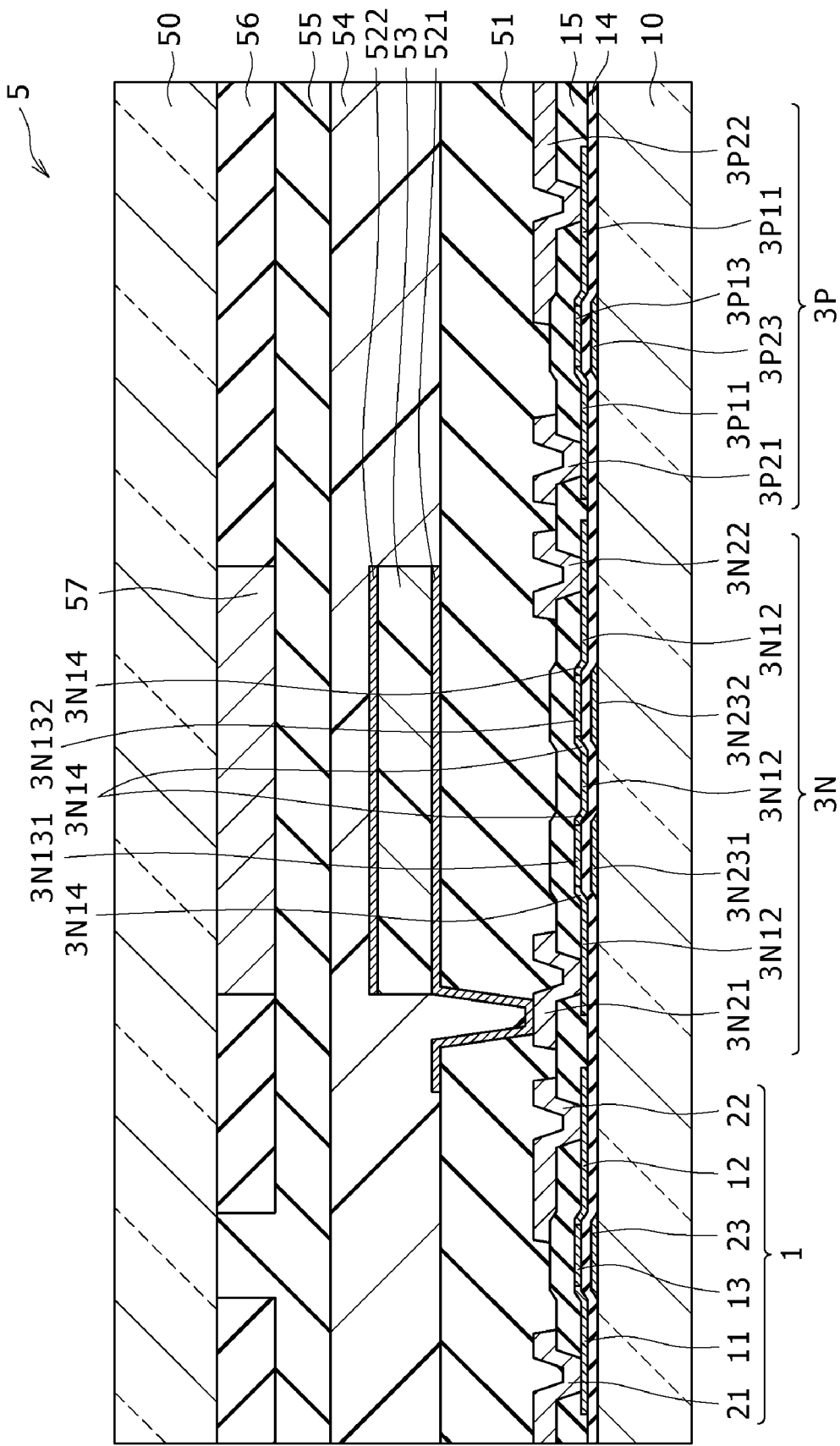
FIG. 26 is a sectional view showing one example of an organic EL display device including the light-receiving element shown in FIG. 1.
Figure 27:
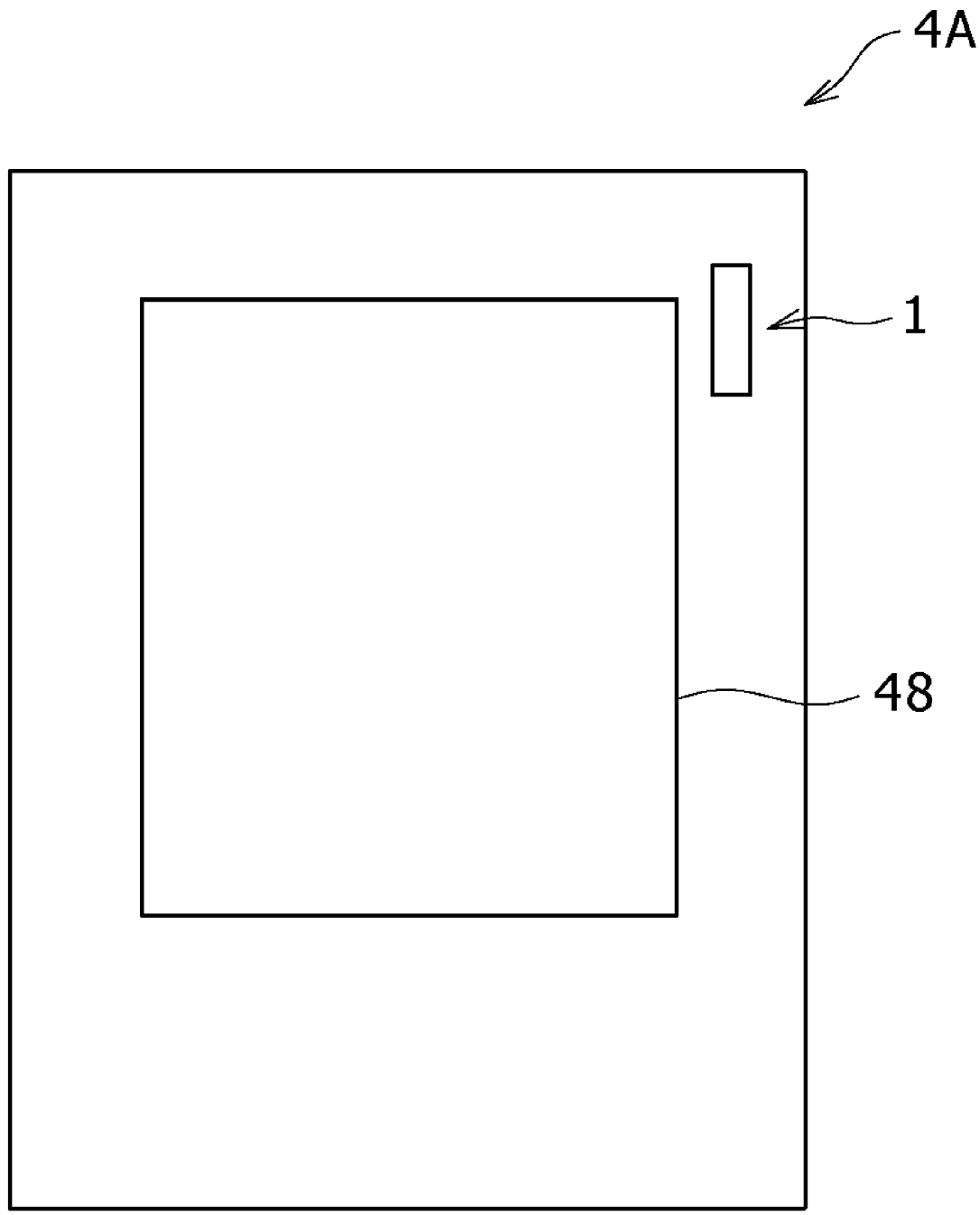
FIG. 27 is a plan view showing another example of a liquid crystal display device including the light-receiving element shown in FIG. 1.

The light-receiving element according to the embodiment of the present invention can be applied to a display device including a display element and a light-receiving element, such as a liquid crystal display device 4 and an organic EL display device 5 shown in FIGS. 24 to 27. This allows reception of ambient light from the external and display light from a display unit 48 or the like, which permits control of display data, the light amount of a backlight, and so on and allows the display device to function as a multi-function display having a touch-panel function, a fingerprint input function, a scanner function, and other functions. Specifically, the liquid crystal display device 4 shown in FIG. 24 includes the light-receiving element 1 or the like according to the above-described embodiment and so on, an N-type TFT 3N, and a P-type TFT 3P. The N-type TFT 3N has a source electrode 3N21, a drain electrode 3N22, gate electrodes 3N231 and 3N232, channel layers 3N131 and 3N132, an n+ layer 3N12, and a lightly-doped drain (LDD) layer 3N14. The P-type TFT 3P has a source electrode 3P22, a drain electrode 3P21, a gate electrode 3P23, a channel layer 3P13, and a p+ layer 3P11. The liquid crystal display device 4 further includes a planarization film 41, a pixel electrode 421, a common electrode 422, a liquid crystal layer 43, a spacer 44, an overcoat layer 45, a black matrix layer 46, a color filter layer 47, and a glass substrate 40. Furthermore, in each pixel 49 in the display unit 48, as shown in FIG. 25, for example, a pixel circuit is formed that has a data line DL, gate lines GL1 to GL3, a power supply line VDD, a ground line GND, a common line COM, a read line RL, a liquid crystal element LC, the light-receiving element 1, pixel selection TFT elements SW1 and SW3, a capacitive element C1, and a source follower element SF. In addition, the organic EL display device 5 shown in FIG. 26 includes the light-receiving element 1 or the like according to the above-described embodiment and so on, the N-type TFT 3N, the P-type TFT 3P, a planarization film 51, an anode electrode 521, a cathode electrode 522, a light-emitting layer 53, a resin layer 54, an overcoat layer 55, a black matrix layer 56, a color filter layer 57, and a glass substrate 50. The position of the light-receiving element 1 or the like is not limited to the inside of the pixel 49, but the light-receiving element 1 or the like may be provided in the peripheral area of the display unit 48 like in e.g. a liquid crystal display device 4A shown in FIG. 27.

Moreover, the configurations and so on according to the above-described embodiment and so on may be combined with each other.

It should be understood by those skilled in the art that various modifications, combinations, sub-combinations and alterations may occur depending on design requirements and other factors insofar as they are within the scope of the appended claims or the equivalents thereof.

What is claimed is:

1. A light-receiving element comprising:
a first-conductivity-type semiconductor region over an element formation surface;
a second-conductivity-type semiconductor region over the element formation surface;
an intermediate semiconductor region over the element formation surface between the first-conductivity-type semiconductor region and the second-conductivity-type semiconductor region, and having an impurity concentration lower than impurity concentrations of the first-conductivity-type semiconductor region and the second-conductivity-type semiconductor region;
a first electrode electrically connected to the first-conductivity-type semiconductor region;
a second electrode electrically connected to the second-conductivity-type semiconductor region; and
a control electrode in an area opposed to the intermediate semiconductor region on the element formation surface with an insulating film therebetween,
wherein,
a conductivity type of an impurity in the intermediate semiconductor region is an n-type, and
the light-receiving element is configured to operate such that a photocurrent generated in the light-receiving element is controlled through a voltage applied to the control electrode, the applied voltage being a negative potential when the conductivity type of the impurity in the intermediate semiconductor region is the n-type.

2. The light-receiving element according to claim 1, wherein
the first electrode is an anode electrode and the second electrode is a cathode electrode, and
the cathode electrode or an electrode electrically connected to the cathode electrode has an opposed region that is opposed to the control electrode with intermediary of at least a part of the intermediate semiconductor region.

3. The light-receiving element according to claim 1, wherein
the control electrode is under the first-conductivity-type semiconductor region, the second-conductivity-type semiconductor region, and the intermediate semiconductor region.

4. The light-receiving element according to claim 1, wherein
the control electrode is over the first-conductivity-type semiconductor region, the second-conductivity-type semiconductor region, and the intermediate semiconductor region.

5. The light-receiving element according to claim 1, wherein
the impurity concentration of the intermediate semiconductor region is equal to or lower than $2 \times 10^{18}$ (atm/cm$^3$).

6. The light-receiving element according to claim 1, wherein
the first-conductivity-type semiconductor region, the second-conductivity-type semiconductor region, and the intermediate semiconductor region include a non-single-crystal semiconductor layer composed of polycrystalline silicon.

7. The light-receiving element according to claim 6, wherein
thickness of the non-single-crystal semiconductor layer is equal to or larger than 30 nm and equal to or smaller than 60 nm.

8. The light-receiving element according to claim 1, wherein
a boundary between the intermediate semiconductor region and the second-conductivity-type semiconductor region is positioned above an end of the control electrode closer to the second-conductivity-type semiconductor region, or is positioned closer to an end of the second-conductivity-type semiconductor region on an opposite side to the boundary than the end of the control electrode.

9. A display device including a plurality of arranged display elements and a light-receiving element, the light-receiving element comprising:
a first-conductivity-type semiconductor region over an element formation surface;
a second-conductivity-type semiconductor region over the element formation surface;
an intermediate semiconductor region over the element formation surface between the first-conductivity-type semiconductor region and the second-conductivity-type semiconductor region, and having an impurity concentration lower than impurity concentrations of the first-conductivity-type semiconductor region and the second-conductivity-type semiconductor region;
a first electrode electrically connected to the first-conductivity-type semiconductor region;
a second electrode electrically connected to the second-conductivity-type semiconductor region; and
a control electrode in an area opposed to the intermediate semiconductor region on the element formation surface with an insulating film therebetween,
wherein,
a conductivity type of an impurity in the intermediate semiconductor region is an n-type, and
the light-receiving element is configured to operate such that a photocurrent generated in the light-receiving element is controlled through a voltage applied to the control electrode, the applied being a negative potential when the conductivity type of the impurity in the intermediate semiconductor region is the n-type.

10. A light-receiving element comprising:
a first-conductivity-type semiconductor region formed over an element formation surface;
a second-conductivity-type semiconductor region formed over the element formation surface;
an intermediate semiconductor region formed over the element formation surface between the first-conductivity-type semiconductor region and the second-conductivity-type semiconductor region, and have an impurity concentration lower than impurity concentrations of the first-conductivity-type semiconductor region and the second-conductivity-type semiconductor region;
a first electrode electrically connected to the first-conductivity-type semiconductor region;
a second electrode electrically connected to the second-conductivity-type semiconductor region; and
a control electrode in an area opposed to the intermediate semiconductor region on the element formation surface with an insulating film therebetween,
wherein,
the light-receiving element is configured to operate such that a photocurrent generated in the light-receiving element is controlled through a voltage applied to the control electrode, a potential of the applied voltage being of the same polarity as a conductivity type of an impurity in the intermediate semiconductor region.

* * * * *